(12) United States Patent
Agassi et al.

(10) Patent No.: US 8,391,937 B1
(45) Date of Patent: Mar. 5, 2013

(54) RADIO FREQUENCY CAVITIES LINED WITH SUPERCONDUCTOR-COATED TILES

(75) Inventors: Yehoshua Dan Agassi, Silver Spring, MD (US); Daniel E. Oates, Belmont, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1223 days.

(21) Appl. No.: 12/079,084

(22) Filed: Mar. 5, 2008

(51) Int. Cl.
*H01P 1/203* (2006.01)

(52) U.S. Cl. ....................................... 505/210

(58) Field of Classification Search ................... 505/210
See application file for complete search history.

(56) References Cited

U.S. PATENT DOCUMENTS

| | | | |
|---|---|---|---|
| 4,609,890 A | 9/1986 | Oates et al. | |
| 5,406,233 A | 4/1995 | Shih et al. | |
| 5,483,122 A | 1/1996 | Derbenev et al. | |
| 5,484,765 A | 1/1996 | Dionne et al. | |
| 5,698,949 A | 12/1997 | Lien et al. | |
| 6,383,989 B2 | 5/2002 | Jia et al. | |
| 6,541,136 B1 | 4/2003 | Kwon et al. | |
| 6,602,588 B1 | 8/2003 | Kwon et al. | |
| 6,624,122 B1 | 9/2003 | Holesinger et al. | |
| 6,635,368 B1 | 10/2003 | Agassi | |
| 6,781,855 B1 | 8/2004 | Oates | |
| 6,919,783 B2 | 7/2005 | Dionne et al. | |
| 6,921,741 B2 | 7/2005 | Arendt et al. | |
| 6,961,597 B1 | 11/2005 | Agassi | |
| 7,276,708 B2 | 10/2007 | Barov | |
| 7,439,208 B2 | 10/2008 | Moeckly et al. | |
| 7,521,708 B1 | 4/2009 | Agassi | |
| 7,761,125 B1 | 7/2010 | Agassi et al. | |
| 7,867,950 B2 | 1/2011 | Moeckly et al. | |
| 8,022,012 B2 | 9/2011 | Moeckly et al. | |
| 8,290,553 B2 | 10/2012 | Moeckly et al. | |
| 2001/0056041 A1 | 12/2001 | Jia et al. | |
| 2003/0125213 A1 | 7/2003 | Kwon et al. | |
| 2003/0144150 A1 | 7/2003 | Arendt et al. | |
| 2007/0069126 A1* | 3/2007 | McIntyre ...................... 250/306 |
| 2008/0176751 A1* | 7/2008 | Tcaciuc et al. ................ 505/210 |
| 2010/0285969 A1 | 11/2010 | Agassi et al. | |

OTHER PUBLICATIONS

G. Wu et al., "Review of SRF Materials Workshop." Proceedings of SRF 2007, Peking University, Beijing, China, Oct. 14-19, 2007, pp. 94-97.

S. Mitsunobu al., "MGB2 Thin Films on NB Cavity by Pulse Laser Deposition," Proceedings of SRF 2007, Peking University, Beijing, China, Oct. 14-19, 2007, pp. 672-674.

(Continued)

*Primary Examiner* — Paul Wartalowicz
(74) *Attorney, Agent, or Firm* — Howard Kaiser

(57) ABSTRACT

As typically embodied, the present invention's RF cavity device comprises a rigid frame and plural flexible tiles. The frame includes walls of at least substantially uniform thicknesses that describe a hollow pillbox shape. The tiles are at least approximately equally thick, each tile being of at least substantially uniform thickness. Each tile includes a flexible metallic substrate and an HTS coating atop the substrate. The tiles are attached via their corresponding substrates to the inside wall surfaces of the frame so that their corresponding HTS coatings are interiorly exposed. The attached tiles flexibly conform to curved surface areas, are snugly set with narrow seams therebetween, and cover at least approximately the entirety of the frame's inside wall surfaces. A filler material is applied to the seams. The resultant tile configuration is characterized by at least approximate levelness of the exposed HTS coating surfaces and the filled seams.

15 Claims, 13 Drawing Sheets

OTHER PUBLICATIONS

N. Cheggour et al., "Reversible Axial-Strain Effect in Y—Ba—Cu—O Coated Conductors," Superconductor Science and Technology, vol. 18, pp. S319-S324, Institute of Physics Publishing, Nov. 7, 2005.

G. Giunchi et al., "A Superconducting Microwave Cavity Made of Bulk MgB2," Superconductor Science and Technology, vol. 20, pp. L16-L19, Institute of Physics Publishing, Feb. 26, 2007.

B. H. Moeckly et al., "Growth of High-Quality Large-Area MgB2 Thin Films by Reactive Evaporation," Superconductor Science and Technology, vol. 19, pp. L21-L24, Institute of Physics Publishing, Mar. 14, 2006.

B. H. Moeckly et al., "Microwave Properties of MgB2 Thin Films Grown by Reactive Evaporation," IEEE Transactions on Applied Superconductivity, vol. 15, No. 2, pp. 3308-3312, Jun. 2005.

D. E. Oates et al., "Intermodulation Distortion and Nonlinearity in MgB2: Experiment and Theory," IEEE Transactions on Applied Superconductivity, vol. 17, No. 2, pp. 2871-2874, Jun. 2007.

Y.D. Agassi, D.E. Oates, and B.H. Moeckly, "Measurement and Modeling of the Low-Temperature Penetration-Depth Anomaly in High-Quality MgB2 Thin Films," Physical C: Superconductivity, vol. 430, pp. 79-93, Oct. 2012 (available online May 9, 2012).

* cited by examiner

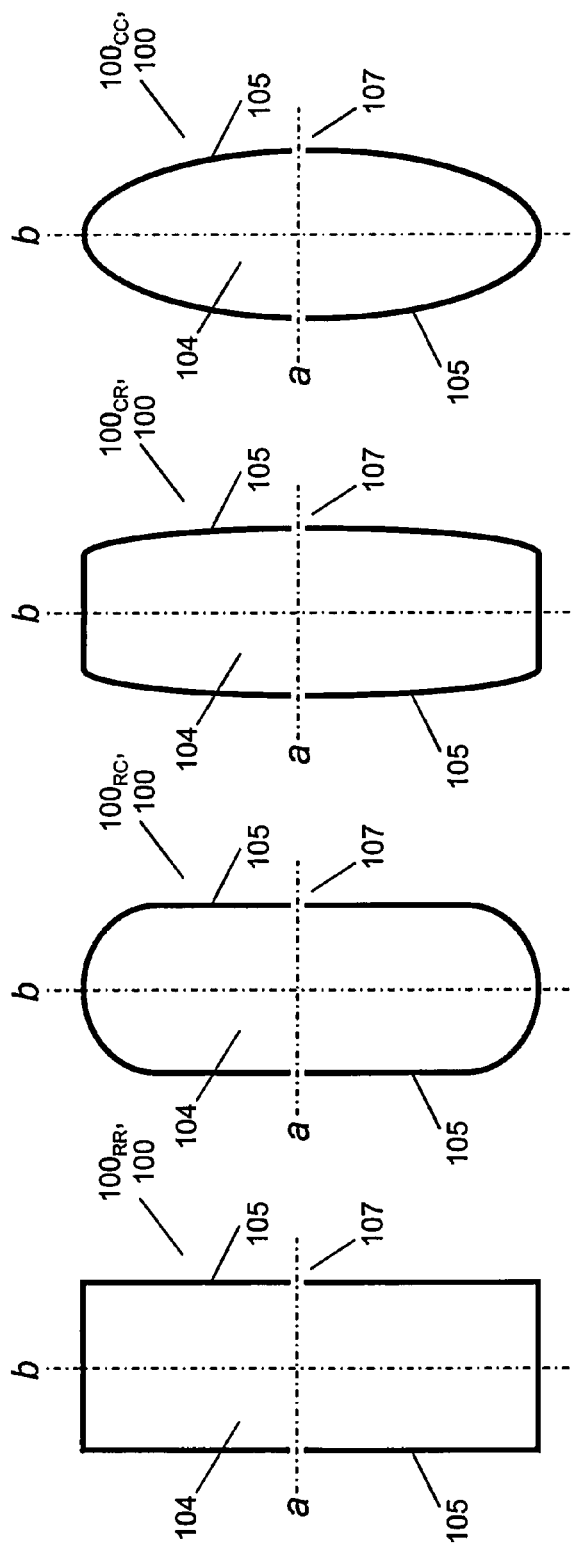

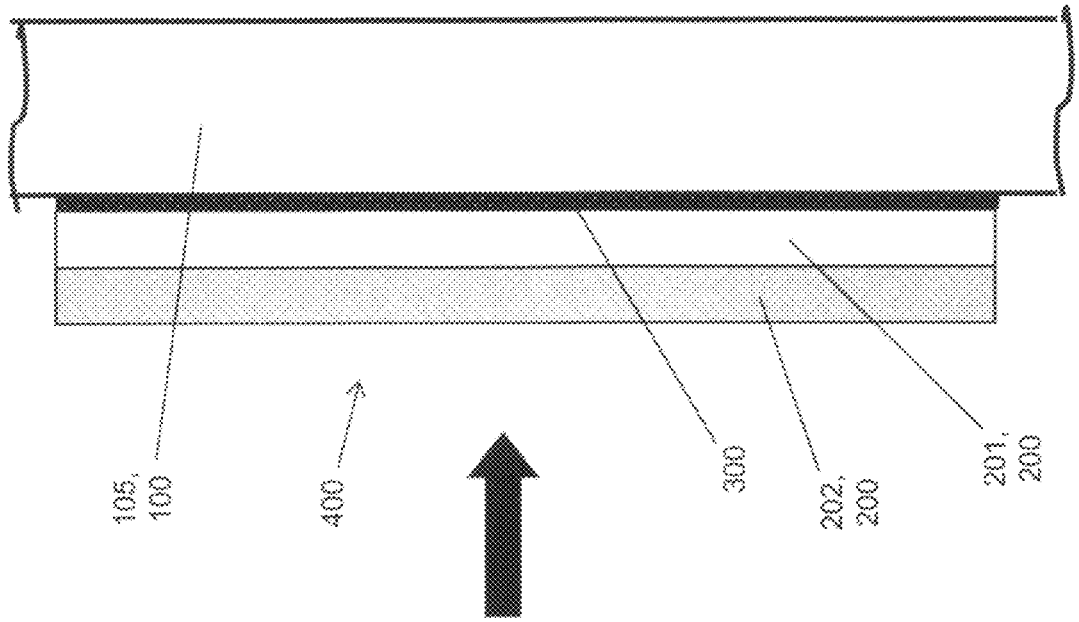
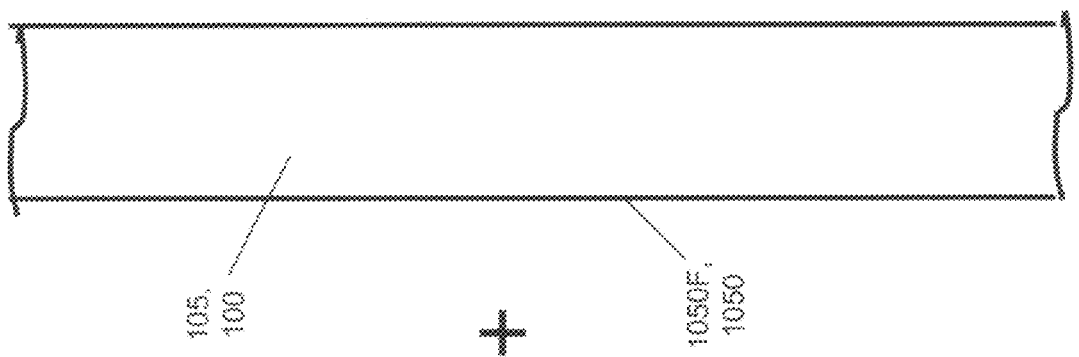
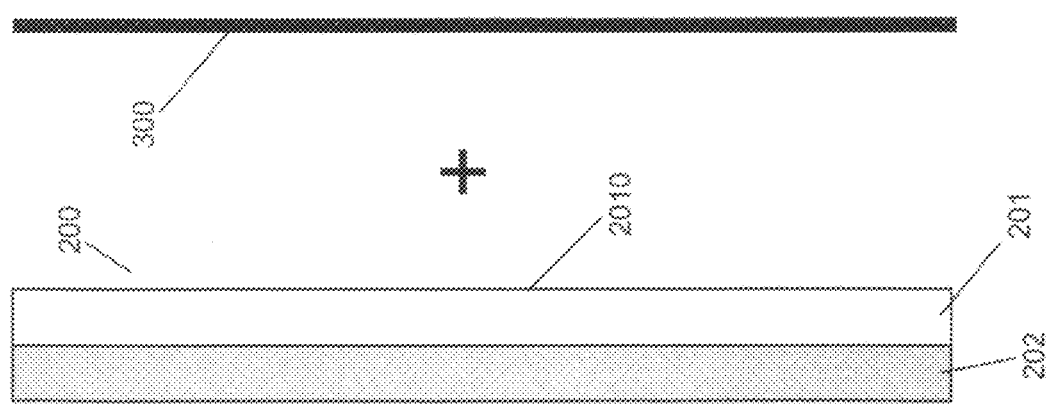
FIG. 10

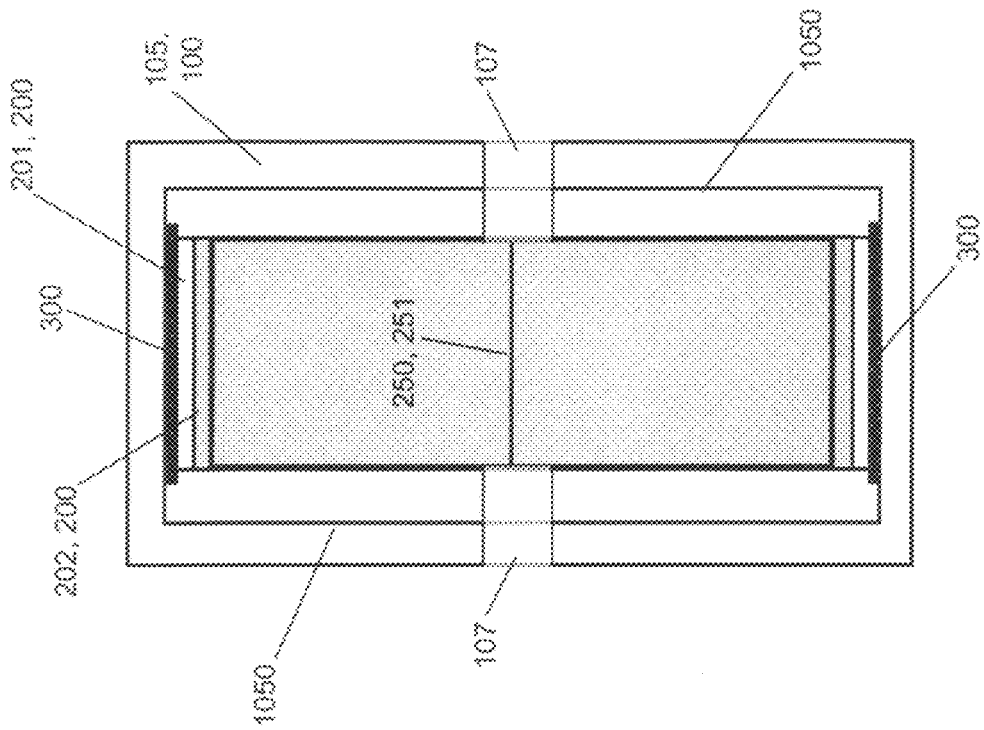
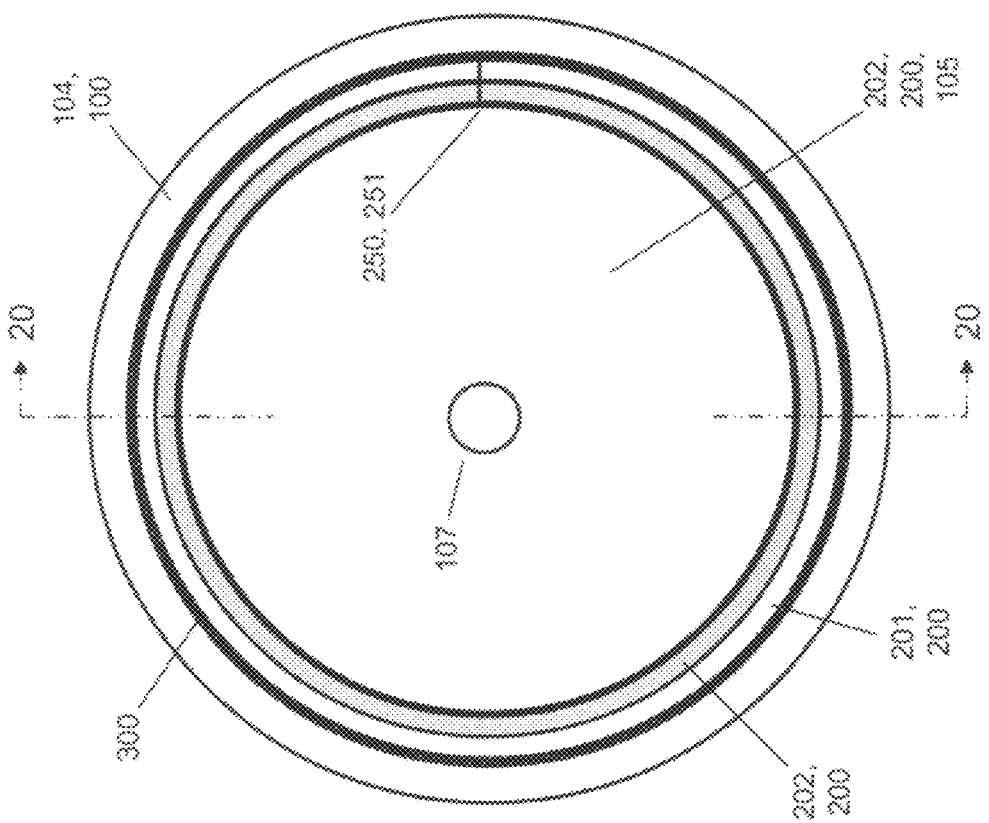

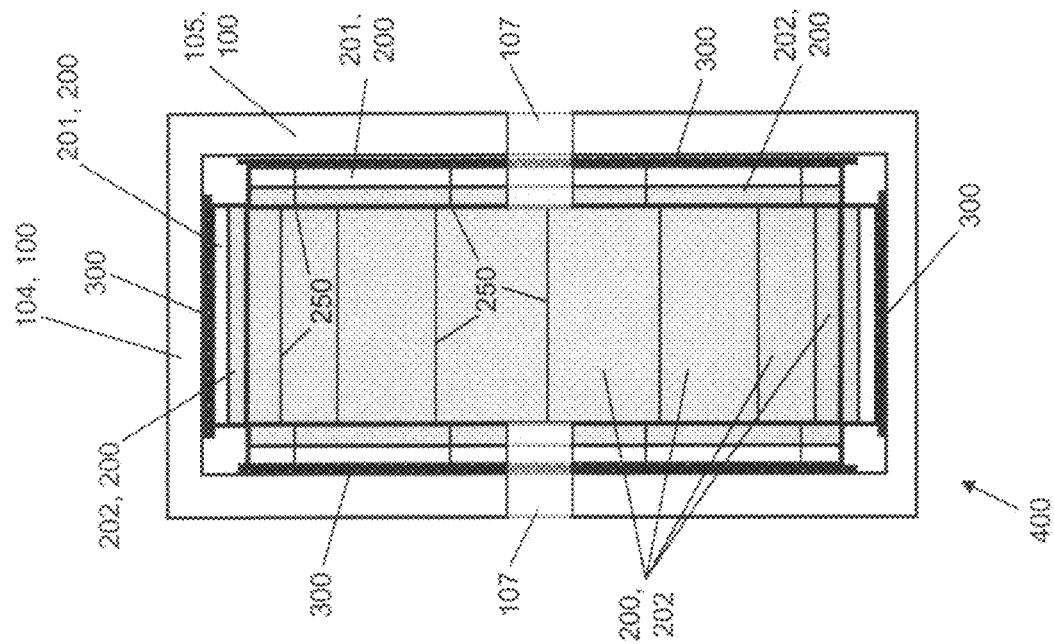
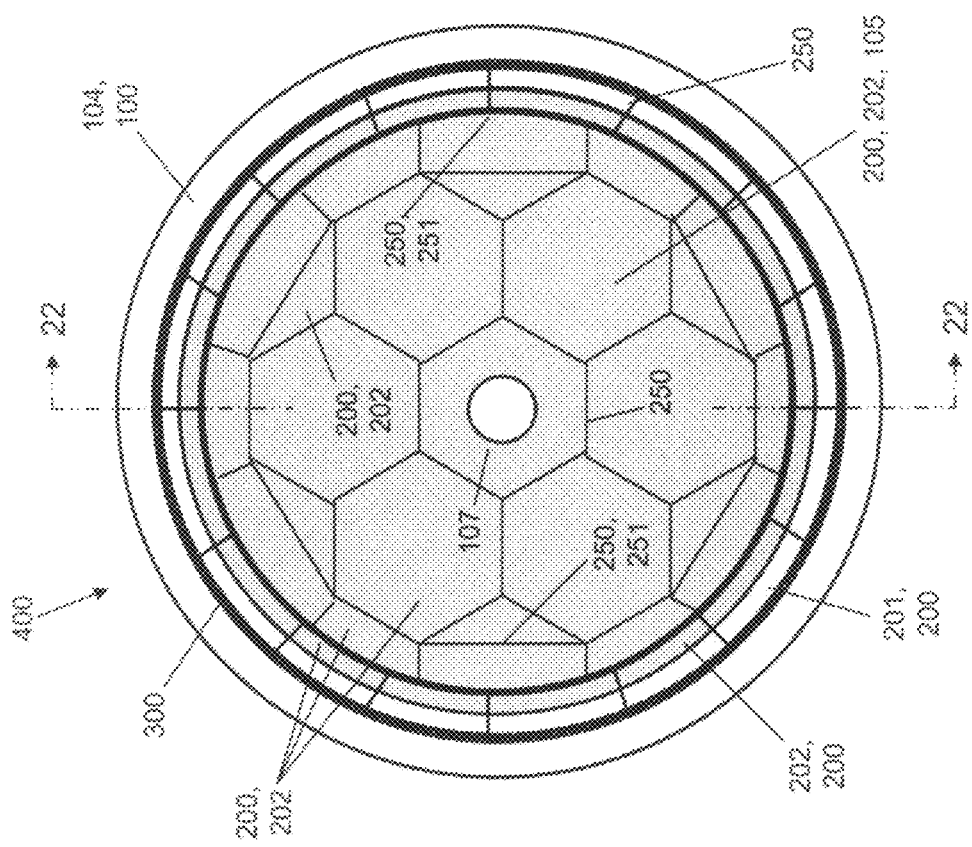
FIG. 21
FIG. 22

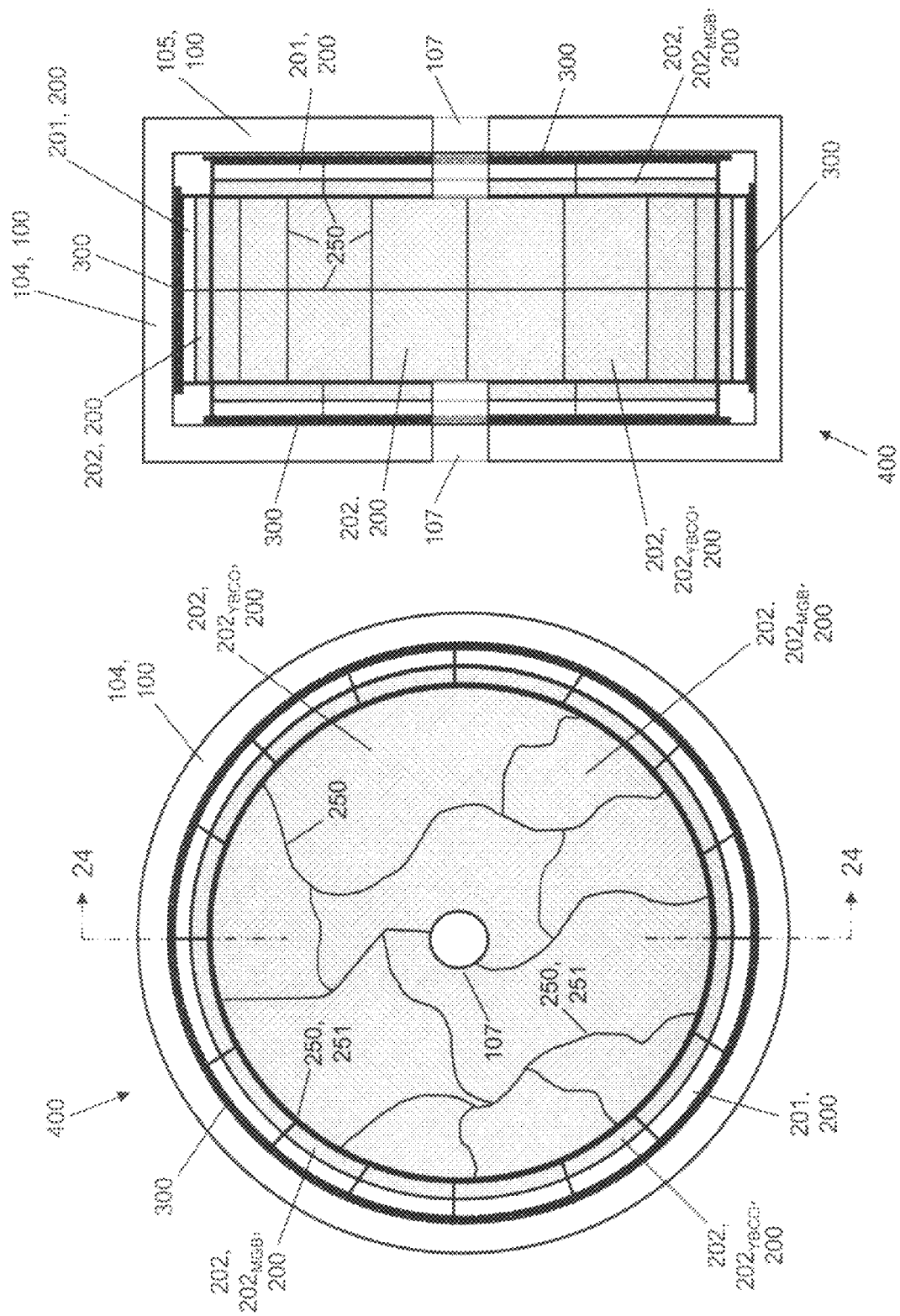

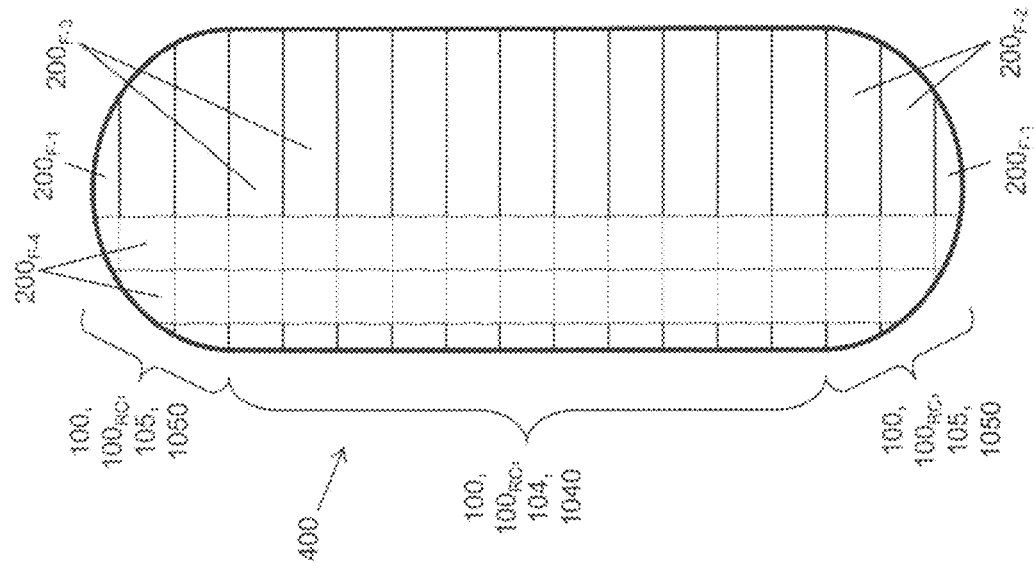
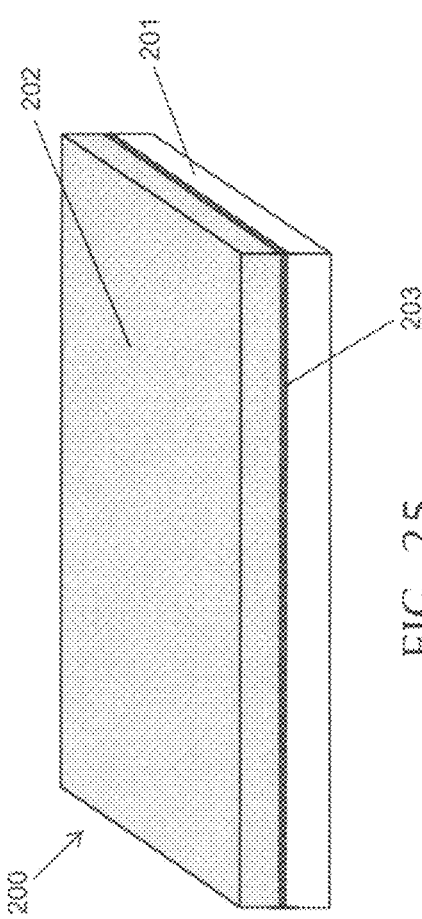
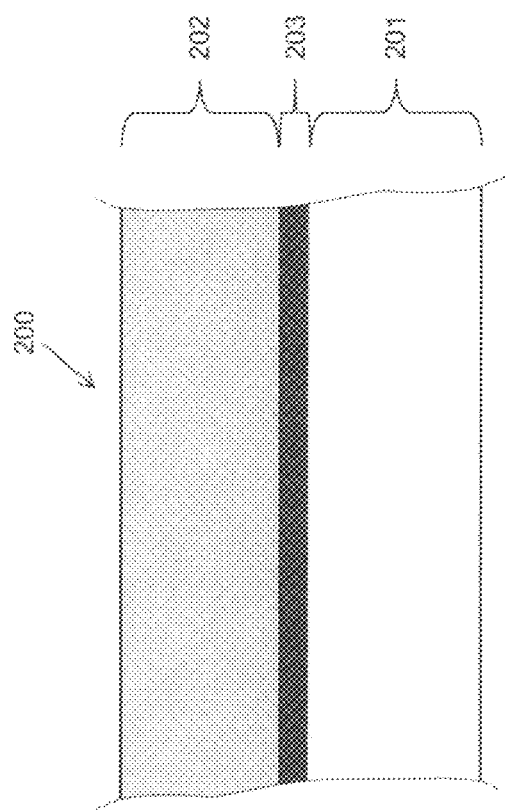

RADIO FREQUENCY CAVITIES LINED WITH SUPERCONDUCTOR-COATED TILES

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to charged particle accelerator devices, more particularly to resonant cavity structures used in particle accelerator devices for sustaining high acceleration fields.

Particle accelerator devices such as high-energy accelerators and free electron lasers (FEL) are designed to accelerate charged atomic particles such as ions, protons, or electrons. Acceleration of a beam of charged particles is traditionally accomplished using a synchronized linear radio frequency (RF) cavity array. Each cavity in such a linear array sustains a high-intensity RF radiation field in order to generate a high acceleration field. A synchronized acceleration electric field $E_{ACC}$ is applied by each cavity along the linear charged-particle beam trajectory. The injected charged-particle beam acceleration is provided by the linear array whereby each cavity imparts an energy increment to the beam. When synchronized properly, these increments add up to the desired high velocity at the end of the linear array.

To maximize the accelerating electric field ($E_{ACC}$) in each such RF cavity, the cavity must sustain a high-power electromagnetic field and a minimum of resistive losses at the cavity's walls. The purpose of using superconductor material in the cavities of conventional particle accelerator devices is to minimize wall losses, thereby promoting long duty cycles. State-of-the-art RF cavities are made of a low temperature superconductor such as niobium (Nb). RF cavity arrays made of bulk Nb are commonly used for free electron lasers and large high-energy-physics-research accelerators. Niobium is the only conventional superconductor that meets the requirements of small surface resistance, high thermal conduction, and ductility; see Ruggero Vaglio, "RF Superconducting Cavities for Accelerators," pp 447-473, *Microwave Superconductivity*, H. Weinstock and M. Nisenoff, Editors, Kluwer Academic Publishers, Dordrecht, 2001. However, by definition a low temperature superconductor material acts as a superconductor only at a low operation temperature, the achievement of which requires liquid helium (He) cooling. Use of niobium, for instance, mandates an operation temperature T in the range T=2-4 K, more commonly at T=2 K.

Critical requirements of a viable RF cavity superconductor material include low surface resistance, high thermal conductivity, some degree of ductility, and amenability to fabrication of large cavity shapes characterized by round (e.g., circular) plan and oval-like cross-section, commonly referred to as "pillbox" shapes. Among conventional superconductors, niobium (critical temperature $T_C$=9.2 K) best matches these requirements; hence, state-of-the-art RF cavities are niobium-based, made either of bulk Nb or Nb-coated copper pre-form. See Vaglio, supra; E. Chiaveri, *IEEE Transactions on Applied Superconductivity* 13, 1199 (2003); P. Kneisel, paper at the Eleventh Workshop on RF Superconductivity, September 2003, Lubeck, Germany (available on compact disc).

Several design considerations determine the wall material, surface morphology and overall shape of the cavity, important among which are the following. Firstly, heat losses should be minimized. If heat losses are sufficiently low, operation is permitted at 100% duty cycle; superconductor material is preferred for this reason. An additional advantage of a superconductor over a metal is that a superconductor's surface resistance scales with frequency f as $f^2$, whereas a metal's surface resistance scales with frequency f as $f^{1/2}$; see Kneisel, supra. Secondly, the magnetic field intensities at the cavity walls' "hot areas" should be reduced so that they do not exceed the superconductor critical field. This consideration has led to pillbox shapes of cavities. Thirdly, "multipacting"—i.e., repeated emission of secondary electrons from imperfections at the cavity's walls—should be reduced. This consideration implies the need to eliminate cavity surface protrusions as much as possible, since it is at these protrusive locations where high local electric fields are present that lead to secondary electron emission. Consequently, the cavity's surface is meticulously treated by electrical and chemical processes, such as etching (See Vaglio, supra; Chiaveri, supra; Kneisel, supra), in order to achieve maximum smoothness. Fourthly, thermal stability should be achieved. Factors such as residual local surface imperfections and field transients can lead to localized heating that can quickly spread throughout the cavity and result in a breakdown. To efficiently diffuse these thermal instabilities, the thermal conductivity of the cavity walls should be maximized, while their surface resistance should be as low as possible. Fifthly, the "manufacturability" of cavities is of great practical importance. The material (e.g., superconductor) must be amenable to the fabrication of structures having large non-flat areas, with some degree of elasticity for mechanical adjustments.

Among conventional superconductors, niobium comes closest to the above materials requirements; see Vaglio, supra; Chiaveri, supra; Kneisel, supra. However, as previously noted herein, the low critical temperature $T_C$ of niobium mandates operation in the temperature range T=2-4 K. This low operation temperature requires a complex, bulky and expensive liquid-helium-based cooling system. Furthermore, the low thermodynamic critical field ($H_C$=0.2 Tesla) of niobium imposes constraints on practicable cavity shapes and on maximally achievable accelerating electric field $E_{ACC}$.

SUMMARY OF THE INVENTION

In view of the foregoing, an object of the present invention is to provide a resonant cavity structure that is more efficient, economical, and versatile than conventional resonant cavity structures.

The present invention's radio frequency (RF) cavity device, as typically embodied, comprises a rigid structure and a plurality of flexible tiles. The rigid structure has an interior space and an inside surface bounding the interior space. Each flexible tile includes a substrate and a superconductor coating upon the substrate. Each flexible tile is coupled with the rigid structure so that its substrate adjoins a portion of the rigid structure's inside surface, and so that its superconductor coating is exposed to the rigid structure's interior space. According to typical inventive fabrication of an inventive RF cavity device, a frame is provided having an interior space and an inside surface bounding the interior space. Plural tiles are adhered to the frame so that each substrate adjoins a portion of the inside surface and each superconductor coating is exposed to the interior space. Typical inventive RF cavity device embodiments have at least one curved inside surface portion. One or more flexible tiles each flexibly conform to the curvature of the adjoining curved inside surface portion.

The present invention is typically embodied as a high performance RF cavity featuring an inner wall that is lined with flexible tiles each of which includes a coating (surface layer) of a high temperature superconductor (HTS) material such as magnesium diboride ($MgB_2$). The term "superconductor," as used herein in the context of inventive practice, broadly refers to either a pure superconductor or a doped superconductor. Inventive embodiments can vary in any of several respects, including the following: (i) the geometry (size and shape) of the inventive resonant cavity structure; (ii) the superconductor material coatings of the tiles; (iii) the number of tiles; (iv) the individual geometries (sizes and shapes) of the tiles; (v) the arrangement of the tiles. The terms "resonant cavity," and "radio frequency cavity" ("RF cavity") are used interchangeably herein.

The present invention is typically practiced whereby the inventive resonant cavity structure is characterized by what is broadly referred to herein as a "pillbox" shape. An inventive resonant cavity can be either homogeneous or heterogeneous with respect to HTS materiality. According to the former inventive mode, all of the tiles of an inventive resonant cavity include a coating of the same HTS material; according to the latter inventive mode, two or more tiles of an inventive resonant cavity differ in their respective HTS material coatings. The overall configuration (layout) of the tiles—including their number, contours and arrangement—may be selected by an inventive practitioner in consideration of several criteria, notable among which are those discussed hereinbelow.

Magnesium diboride ($MgB_2$; commonly designated "MGB") is a recently discovered superconductor having critical temperature $T_C$=39 K; see P. Canfield and G. W. Crabtree, *Physics Today*, March 2003, p 34; S. Souma et al., *Nature* 423, 65 (2003); H. J. Choi et al., *Nature* 418, 758 (2002); *Physics Today*, April 2001, p 17. The recent discovery of MGB suggested to the present inventors the possibility of MGB-based RF cavities. The present inventors recognized that MGB-coated RF cavities can alleviate the need for liquid-He cooling. The present inventors further recognized that the brittleness of MGB renders problematic the fabrication of such a cavity, particularly because of curved surfaces. The present invention succeeds in overcoming the MGB brittleness obstacle by tiling the inner surface of an RF cavity with MGB-coated metallic tiles. As compared with Nb-based RF cavities, $MgB_2$-based RF cavities potentially afford equal or superior performance as well as lower manufacture and operation costs.

A tile suitable for inventive implementation typically includes a suitable metallic substrate and an HTS coating situated on the metallic substrate. The metallic substrate can be, for instance, a metal such as titanium, aluminum, or nickel, or a metal alloy such as stainless steel. According to usual inventive practice the substrates are metallic, but inventive practice can provide for substrates that are non-metallic. A key attribute of the present invention's tile substrate is its sufficient flexibility (e.g., bendability or pliability) for permitting coupling thereof with a non-flat surface, which can manifest a significant degree of curvature, depending on the inventive embodiment; various metallic materials, and even some non-metallic materials (e.g., composites), may meet this flexibility criterion. A key attribute of the present invention's tile superconductor coating is its ability to flex (e.g., bend) in concert with its tile substrate so as to retain or substantially retain its superconducting character. According to typical inventive practice, the HTS-coated metallic tiles are relatively large (macroscopic), high in quality, flexible, and of uniform thickness, and are adhered in a strategically configured manner onto the inside surface of the inventive resonant cavity.

The present invention's MGB-coated metal tiles can be fabricated via techniques that have recently become known, particularly those techniques involving state-of-the-art MGB film growth technology. For instance, in the following paper, incorporated herein by reference, B. H. Moeckly et al. describe a methodology that can be practiced for making the present invention's MGB-coated metallic tiles: B. H. Moeckley and W. S. Ruby, "Growth of High-Quality Large-Area $MgB_2$ Thin Films by Reactive Evaporation," *Superconducting Science and Technology*, Volume 19, pages L21-L24 (14 Mar. 2006). The inventive concepts are applicable to HTS materials other than MGB, and allow for "hybrid" inventive cavity designs, in which not all of the tiles are coated with the same HTS material.

As elaborated upon in the next few paragraphs, the present invention's novel MGB-based resonant cavities potentially afford distinct advantages over conventional Nb-based resonant cavities in terms of material properties including the following: critical temperature; surface resistance; upper critical field; lower critical field; thermal conductivity; material cost; substrate compatibility.

Since MGB has a high critical temperature, typical embodiments of the present invention's MGB-based cavity can operate in the range T=5-20 K. This operation temperature can be accomplished by a cooling system based on gaseous helium, for instance—rather than liquid helium. A gaseous helium cooling system would carry substantial savings in terms of footprint, power consumption, simplified logistics and enhanced reliability—thus comparing favorably with a liquid helium cooling system, which is needed for niobium-based cavities.

Recent data obtained by the present inventors imply that the surface resistance of MGB is comparable to that of Nb films at the same reduced temperature T/Tc, and is lower than that of Nb films at the same absolute temperature. This property of low surface resistance of MGB entails significant savings in the idle cooling-system load.

At T=0 K, the upper critical field $H_{C_t}$ of MGB is either 16 Tesla or 5 Tesla, depending on the direction of the field, as MGB is anisotropic; see Canfield et al., supra; Souma et al., supra; Choi et al., supra; *Physics Today*, April 2001, supra. For doped MGB, significantly higher fields have been measured; see C. Ferdeghini et al., *IEEE Trans. Applied Supercon.* 15, 3234 (2005); C. Tanatini et al., *IEEE Trans. Applied Supercon.* 15, 3223 (2005); V. Braccini et al., *Phys. Rev. B* 71, 012504 (2005); M. Angst et al., *Phys. Rev. B* 71, 144512 (2005); A. Gurevich, *Phys. Rev. B* 67, 184515 (2003). By comparison, in Nb, $H_C$=0.2 T; T. Van Duzer and C. W. Turner, *Principles of Superconductive Devices and Circuits*, Elsevier, New York, 1981. These data indicate that MGB-based cavities can potentially sustain very high acceleration fields.

The thermal conductivity of MGB at T≈10 K is 25 W/(mK), rising steeply with temperature; see M. Putti et al., *Superconductor Sci. Technology* 16, 188 (2003). By comparison, the thermal conductivity of Nb at T=3 K is ≈10-20 W/(mK); see T. Van Duzer and C. W. Turner, *Principles of Superconductive Devices and Circuits*, Elsevier, New York, 1981. These figures imply that the thermal conductivity of MGB is comparable to that of Nb at a substantially higher temperature.

The lower critical field in MGB is estimated at $H_{C_1}$ ~150 Oe; see M. Tinkham, *Introduction to Superconductivity*, 2nd Edition, McGraw-Hill, Inc., New York, 996, page 154. By comparison, the lower critical field in Nb is estimated at $H_{C_1}$ ~33 Oe. This indicates a reduction of vortex penetration into MGB at elevated power levels, and hence a reduction of nonlinearity associated with extrinsic vortex-motion nonlinearity, as compared to Nb.

MGB represents a simple composition of common elements, and Nb is a relatively uncommon element; therefore, the commercial price of MGB is considerably less than that of Nb. As for substrate compatibility, some metallic substrates, such as nickel (Ni) and stainless steel, have been found to be compatible with MGB deposition.

MGB is a brittle material; see Canfield et al., supra. While other material properties of MGB lend attractiveness to the present invention's MGB-based RF cavities, a major impediment to the realization of an inventive device is the brittleness of MGB. MGB is classified as a (boride) ceramic and, as such, is granular in nature. This property of MGB—which is common to other high temperature superconductors, such as yttrium barium copper oxide ("YBCO")—poses a challenge for coating large, non-flat surface areas with a high quality MGB film. The present invention meets this challenge. Rather than coat large non-flat surfaces with a continuous high-quality MGB film, the present invention tiles large non-flat surfaces with MGB-coated tiles each comprising a flexible metallic substrate and a high-quality MGB film deposited thereon. The present invention thus avails itself of the elasticity of MGB. Inventive principles can be applied to other known, or yet-to-be-discovered, high temperature superconductors, regardless of their character in terms of brittleness. YBCO, for instance, is a candidate HTS film material for inventive practice, but it is more difficult and expensive to make than MGB in the current state of the technology.

In a sense, the present invention shifts the focus from achieving a high-quality surface over an entire cavity interior, to achieving a high-quality surface on individual tiles of smaller areas; this represents a propitious shift of focus, as the former is considerably more difficult than the latter. The higher operation temperatures (greater than T=2-4 K) of the present invention translate to substantial reductions in the cost and complexity of the helium cooling, because gaseous-He cooling can be implemented vice liquid-He cooling. Inventive utilization of tiles may also result in reduced costs. Inventive practice may be expected to have associated therewith a high acceleration field $E_{ACC}$ (~12 MV/m or higher, based on current data). The present invention's hybrid cavity embodiments, in which at least two different superconductor materials are used as tile coatings, may expand the possibilities of inventive practice—for instance, with respect to shapes of inventive cavities—because of the inherent differences in the material properties of the different superconductor materials. Inventive practice lends itself to modularity, and to exploration of new shapes that are easier to manufacture.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein:

FIG. 1, FIG. 2, FIG. 3, and FIG. 4 are axially longitudinal elevation views of four embodiments of an RF cavity preform characterized by a pillbox shape.

FIG. 1 has an axially directed profile that is completely rectangular, i.e., straight at the axial extremes and straight along the axis;

FIG. 2 has an axially directed profile that is partially rectangular and partially oval, i.e., straight at the axial extremes and arcuate along the axis;

FIG. 3 has an axially directed profile that is partially oval and partially rectangular, i.e., arcuate at the axial extremes and straight along the axis;

FIG. 4 has an axially directed profile that is completely oval, i.e., arcuate at the axial extremes and arcuate along the axis.

FIG. 5 is an axially transverse elevation view of any of the RF cavity preform embodiments shown in FIG. 1 through FIG. 4.

FIG. 10 is a schematic of adherence of an inventive tile, such as the inventive tile embodiment shown in FIG. 6, to a flat inside surface area of an RF cavity preform.

FIG. 13 also shows, superimposed thereon in dotted line image, an axially transverse cross-sectional view of an oval RF cavity preform embodiment similar to that shown in FIG. 4.

FIG. 19 and FIG. 20 are the views of FIG. 15 and FIG. 16, respectively, but showing inventive tile coverage of the circumferential wall only. The view of FIG. 20 is taken essentially through a geometric plane indicated by section line 20-20 in FIG. 19.

FIG. 21 is an axially transverse cross-sectional view, similar to the view of FIG. 13, of another embodiment of an RF cavity in accordance with the present invention.

FIG. 22 is an axially longitudinal cross-sectional view of the inventive RF cavity embodiment shown in FIG. 21, taken essentially through a geometric plane indicated by section line 22-22 in FIG. 21. According to the inventive embodiment shown in FIG. 21 and FIG. 21, multiple inventive tiles of various polygonal or curvedly polygonal shapes (e.g., triangular, rectangular, non-rectangular quadrilateral, hexagonal, etc.) are implemented to cover the two axial-end walls of the RF cavity preform shown in FIG. 13.

FIG. 23 is an axially transverse cross-sectional view, similar to the view of FIG. 13, of another embodiment of an RF cavity in accordance with the present invention.

FIG. 24 is an axially longitudinal cross-sectional view of the inventive RF cavity embodiment shown in FIG. 23, taken essentially through a geometric plane indicated by section line 24-24 in FIG. 21. According to the inventive embodiment shown in FIG. 23 and FIG. 24, inventive tiles of highly irregular shapes are implemented to cover the two axial-end walls of the RF cavity preform shown in FIG. 13. Also according to the inventive embodiment shown in FIG. 23 and FIG. 24, a double array of rectangular tiles (as distinguished from the single array of rectangular tiles shown in FIG. 22) is implemented to cover the circumferential wall of the RF cavity preform shown in FIG. 13.

FIG. 25 is a perspective view of another embodiment of an HTS-coated metallic tile in accordance with the present invention. As distinguished from the inventive tile embodiment shown in FIG. 6, the inventive tile embodiment shown in FIG. 25 includes a thin buffer layer between the superconductor layer and the substrate layer.

FIG. 26 is a side elevation view ("edgewise" view), partial and enlarged, of the inventive tile embodiment shown in FIG. 25.

FIG. 27 is a cross-sectional axially longitudinal elevation view of an embodiment of an inventive RF cavity having a shape similar to that of the RF cavity preform shown in FIG. 2. FIG. 27 particularly illustrates frustum-shaped tiles lining the interior of the RF cavity preform.

DETAILED DESCRIPTION OF THE INVENTION

Figure 6:
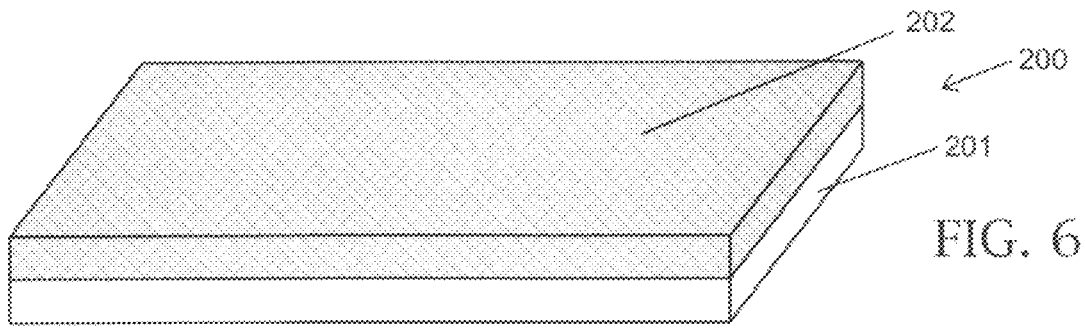
FIG. 6 is a perspective view of an embodiment of an HTS-coated metallic tile in accordance with the present invention.

Referring now to FIG. 1 through FIG. 5, cavity preforms 100 that are suitable for inventive practice are typically characterized by conventional "pillbox" shapes. The terms "cavity preform" and "cold cavity" are used synonymously herein to refer to the "superconductor-less" frame of an RF cavity, i.e., the basic RF cavity structure, absent superconductor material. A cavity preform is typically a rigid, hollow, "walling" structure, and is typically made of a metallic (metal or metal alloy) material, although it could be made of another (e.g., ceramic or composite) suitable material. The term "pillbox" is broadly used herein to describe a shape that is cylindrical or generally cylindrical.

As depicted in FIG. 1 through FIG. 4, pillbox cavity preform 100 is characterized by lateral symmetry, straight and/or curved, with respect to its geometric planar bisector b, with respect to which its geometric axis a is perpendicular. As further depicted in FIG. 1 through FIG. 4, a pillbox cavity preform 100 is characterized a profile in the direction of its geometric axis a that has indicia of rectangularity and/or ovality. An inventive pillbox-shaped cavity preform is usually of relatively short axial length, thus describing or generally describing a disk shape, akin to a "hockey puck."

According to the FIG. 5 depiction of pillbox cavity preform 100, geometric planar bisector b is in parallel with the geometric plane described by the page. As illustrated in FIG. 5, a pillbox cavity preform 100 is characterized by a circular circumferential symmetry with respect to its geometric axis a. Pillbox cavity preforms $100_{RR}$, $100_{RC}$, $100_{CR}$, and $100_{CC}$ are each characterized by circularity in perpendicular relation to its geometric axis a; that is, each pillbox cavity preform 100 has a circular circumferential portion 104, with circular geometric cross-sections of either constant or varying sizes in geometric planes perpendicular to geometric axis a. FIG. 5 may be considered to portray either one of the two axial ends 105 of a cavity preform 100, which is hollow. Each axial end 105 has a small central aperture 107 that is aligned with geometric axis a, thereby permitting passage, along geometric axis a and through cavity preform 100, of a beam of subatomic particles, e.g., protons or electrons.

A geometric "pillbox" shape can have an axially directed profile that is: entirely rectilinear (such as shown in FIG. 1); or, both rectilinear and curvilinear (such as shown in FIG. 2 and FIG. 3); or, entirely curvilinear (such as shown in FIG. 4). The scope of possible geometric pillbox shapes that are suitable for inventive practice runs the gamut—with varying gradations of curvature—from pure rectilinearity of its axially directed profile, through combined rectilinearity and curvilinearity of its axially directed profile, to pure curvilinearity of its axially directed profile. The possible geometric pillbox shapes are also variable in terms of the aspect ratio (e.g., ratio of length along axis a, to width along plane b) of the axially directed profile.

For purposes of this discussion, it is assumed that the "walls" of a pillbox cavity preform 100 are each at least substantially uniform in thickness, and hence the inside and outside surfaces of the walls are at least substantially correspondent in terms of their respective shapes. The walls may be (but need not be) equal or approximately equal in thickness vis-à-vis each other. The term "wall," as used herein in the context of describing a cavity preform 100, denotes a wall portion of the overall walling structure represented by the cavity preform 100, and is not intended to necessarily suggest either structural discreteness or structural distinctness vis-à-vis any other "wall" that is included in the overall walling structure. The overall walling structure described by a cavity preform 100 is considered herein to comprise an axial-longitudinal (i.e., circumferential) wall 104 and two axial-end walls 105.

Pillbox cavity preform $100_{RR}$ (shown in FIG. 1 and FIG. 5) is cylindrical in the strictest geometric sense, having a rectangular profile; pillbox cavity preform $100_{RR}$ has two flat axial-end walls 105, and an axial-longitudinal (circumferential) wall 104 that is straight in the axial direction a. Pillbox cavity preform $100_{RC}$ (shown in FIG. 2 and FIG. 5) is "generally" cylindrical, having a rectangular-oval profile; pillbox cavity preform $100_{RC}$ has two flat axial end walls 105, and an axial-longitudinal (circumferential) wall 104 that is curved (e.g., manifesting a "U"-shaped curve) in the axial direction a. Pillbox cavity preform $100_{CR}$ (shown in FIG. 3 and FIG. 5) is "generally" cylindrical, having an oval-rectangular profile; pillbox cavity preform $100_{CR}$ has two curved (e.g., convex) axial-end walls 105, and an axial-longitudinal (circumferential) wall 104 that is straight in the axial direction a. Pillbox cavity preform 100$_{CC}$ (shown in FIG. 4 and FIG. 5) is "generally" cylindrical, having an oval or approximately oval profile; pillbox cavity preform 100$_{CC}$ has two curved (e.g., convex) axial-end walls 105, and an axial-longitudinal (circumferential) wall 104 that is curved (e.g., manifesting a "U"-shaped curve) in the axial direction a. Pillbox cavity preforms 100$_{CR}$ and 100$_{CC}$ each represent a kind of biconvex shape, but are distinguishable insofar as pillbox 100$_{CR}$ has an axially level circumference, whereas pillbox 100$_{CC}$ has an axially rounded circumference.

As further discussed hereinbelow, a variety of design choices can be made by the inventive practitioner with regard to the shape of the pillbox cavity preform 100. Many cavity preforms 100 will be selected in inventive practice so as to be more akin to cavity preforms 100$_{RC}$, 100$_{CR}$ and 100$_{CC}$ (which are generally cylindrical, having a degree of roundedness along longitudinal axis a and/or along bisector plane b), than to cavity preform 100$_{RR}$ (which is purely cylindrical). The angular junctures between the circumferential wall 105 and the end walls 104 of a rectilinearly profiled (e.g., rectangular) pillbox preform 100, such as illustrated by pillbox cavity preform 100$_{RR}$ (FIG. 1), will tend to result in multipacting at these locations. On the other hand, the relatively high curvatures characterizing an oval-profile pillbox preform 100, such as illustrated by pillbox cavity preform 100$_{CC}$ (FIG. 4), may exceed the limits to which the present invention's tiles may flex without compromising their superconductive character.

The afore-noted publication by B. H. Moeckley and W. S. Ruby, entitled "Growth of High-Quality Large-Area MgB$_2$ Thin Films by Reactive Evaporation," discloses the in situ growth of large area, high quality magnesium diboride films deposited on various thin substrates (single-crystal sapphire, polycrystalline alumina, silicon, stainless steel, etc.), up to four inches in width/diameter, via a methodology that includes reactive evaporation deposition. Moeckley et al. refer to their MGB-film-upon-substrate combinations as "wafers." It is reasonable to infer from Moeckley et al. that various "single-crystalline, polycrystalline, metallic, and semiconductor materials" (See Moeckley et al., Abstract) other than those specifically disclosed by Moeckley et al. can be used as substrate materials according to their wafer fabrication method. It is also reasonable to suppose that Moeckley et al.'s fabrication principles may be applicable when a superconductor material other than MGB is the film upon the substrate. Large area (e.g., 2-4" diameter/width) MGB-film-upon-substrate wafers have recently begun to be manufactured on a quasi-commercial basis. A typical wafer in accordance with the teachings of Moeckley et al. includes a flexible metallic substrate (stainless steel, titanium, etc.) and a high quality MGB thin film deposited on the flexible metallic substrate.

According to the wafer fabrication method of Moeckley et al., the substrate is mounted on a rotating shaft in an evacuated growth chamber, thereby exposing the substrate, in the course of a revolution, to both a boron (B) gun and magnesium (Mg) vapor confined to a pocket heater. Moeckley et al.'s method typically yields a film having a sharp superconducting transition at the critical temperature (e.g., ~1 K width at T≈39 K), a smooth surface having a low amount of surface roughness (e.g., ~4 nm), and a low level of nonlinearity. By comparison, the typical inside surface roughness of a state-of-the-art Nb cavity, after surface treatment, is about 100 nm. Moreover, the low power surface resistance of an MGB-film-upon-substrate wafer according to Moeckley et al. is comparable to that of a state-of-the-art Nb cavity.

The present invention, as typically embodied, utilizes flexible HTS-coated metallic planar members to line (cover) at least a portion of the overall interior surface of a cavity preform. These inventive planar members are also referred to herein as inventive "tiles." A suitable adhesive material (e.g., a suitable glue, paste, epoxy, or cement) is used to effect adherence (bonding) of the inventive tiles to the inside surface of the cavity preform. A preferred method of making inventive tiles is the afore-described method of making MGB-film-upon-substrate wafers according to Moeckley et al.

With reference to FIG. 6 through FIG. 11, inventive HTS-coated metallic tiles 200 are used to cover the inside surfaces 1040 and 1050, of walls 104 and 105, respectively, of an RF cavity preform 100. Each inventive tile 200 includes a metallic layer 201 (for being adhered to the interior surface 101 of an RF cavity preform 100) and an HTS (e.g., MGB) layer 202 (for being exposed on the inside the RF cavity preform 100). If an inventive tile 200 is fabricated according to the afore-discussed wafer fabrication method of Moeckley et al., then metallic layer 201 is the substrate, and MGB layer 202 is the coating upon the substrate.

According to typical inventive practice, the inventive tiles 200 are made flat (planar), for instance as shown in FIG. 6 through FIG. 11. Typically, each tile 200 is of uniform or substantially uniform thickness. Further typically, all of the tiles 200 utilized for a particular preform 100 are of equal or approximately equal thickness. Non-uniformity and/or inequality of individual and/or comparative tile 200 thicknesses are also possible in inventive practice. As illustrated in FIG. 10, the flatness (when not subjected to flexural strain) of a typical inventive tile 200 facilitates its adherence to a flat interior surface region of the walling structure of a pillbox cavity preform 100. A pillbox cavity preform 100 usually defines a geometric circle in geometric planes perpendicularly across the geometric axis a; therefore, generally speaking, any entirely flat interior surface region that a cavity preform 100 may have would be a flat surface region 1050F of the interior surface 1050 of one of the two axial-end walls 105. Adhesive material 300 is applied to the flat metallic substrate surface 2010 of the inventive tile 200, and/or to the flat inside surface region 1050F of the axial wall 105's inside surface 1050. The inventive tile 200 is then pressed upon the flat inside surface region 1050F to effect adherence, with very little or no flexing (bending) of inventive tile 200 taking place.

Figure 11:
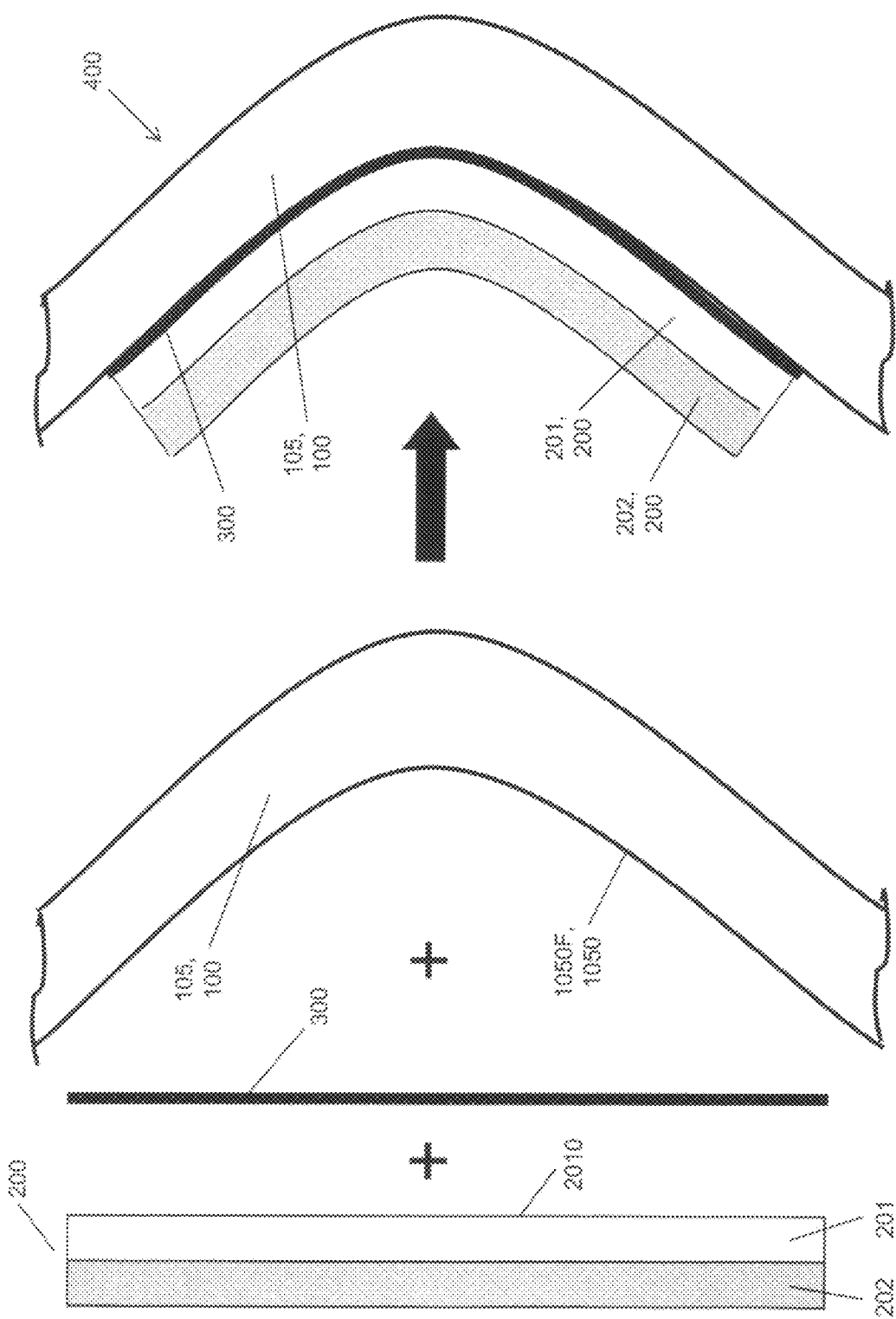
FIG. 11 is a schematic of adherence of an inventive tile, such as the inventive tile embodiment shown in FIG. 6, to a curved inside surface area of an RF cavity preform.

As illustrated in FIG. 11, an inventive tile 200 as typically embodied is sufficiently flexible (bendable) to flex (bend) in conformance with a non-flat (e.g., curved) interior surface region of a cavity preform 100. The inventive tile 200 shown in FIG. 11 is being adhered to a curved region of either the interior surface 1040 or one of the two interior surfaces 1050. Adhesive material 300 is applied to the metallic substrate surface 2010 of the inventive tile 200, and/or to a non-flat inside surface region of cavity preform 100. This non-flat inside surface region can be either a non-flat inside surface region 1050N of the inside surface 1050 of one of the two axial walls 105's, or a non-flat inside surface region 1040N of the inside surface 1040 of the circumferential wall 104. To effect adherence, the inventive tile 200 is flexed before and/or during the pressing thereof upon the non-flat inside surface region 1040N or 1050N.

The flexibility of MGB wafers fabricated according to Moeckley et al. is an essential attribute for performing inventive tiling of non-flat inner surface regions 1040N and 1050N of an RF cavity preform 100. While the existing data on the elasticity of magnesium diboride is scant, whatever data is available bodes well for inventive practice. As elaborated upon hereinbelow, supporting data is provided by Moeckley et al. and Cheggour et al.

As disclosed by B. H. Moeckley et al. in a presentation at the Ninth Symposium on High Temperature Superconductors in High Frequency Fields, 25-28 Jun. 2006, Cardiff, United Kingdom, small wafers of MGB coated upon nickel (Ni) were checked for variations of the critical temperature due to their flexure. After the wafers were flexed to a degree that corresponds to curvature radius of about 0.5 cm, no variation in critical temperature was observed. This curvature radius depends on the sample thickness; nevertheless, no systematic, quantified data exists on the flexibility of such wafers.

Figure 12:
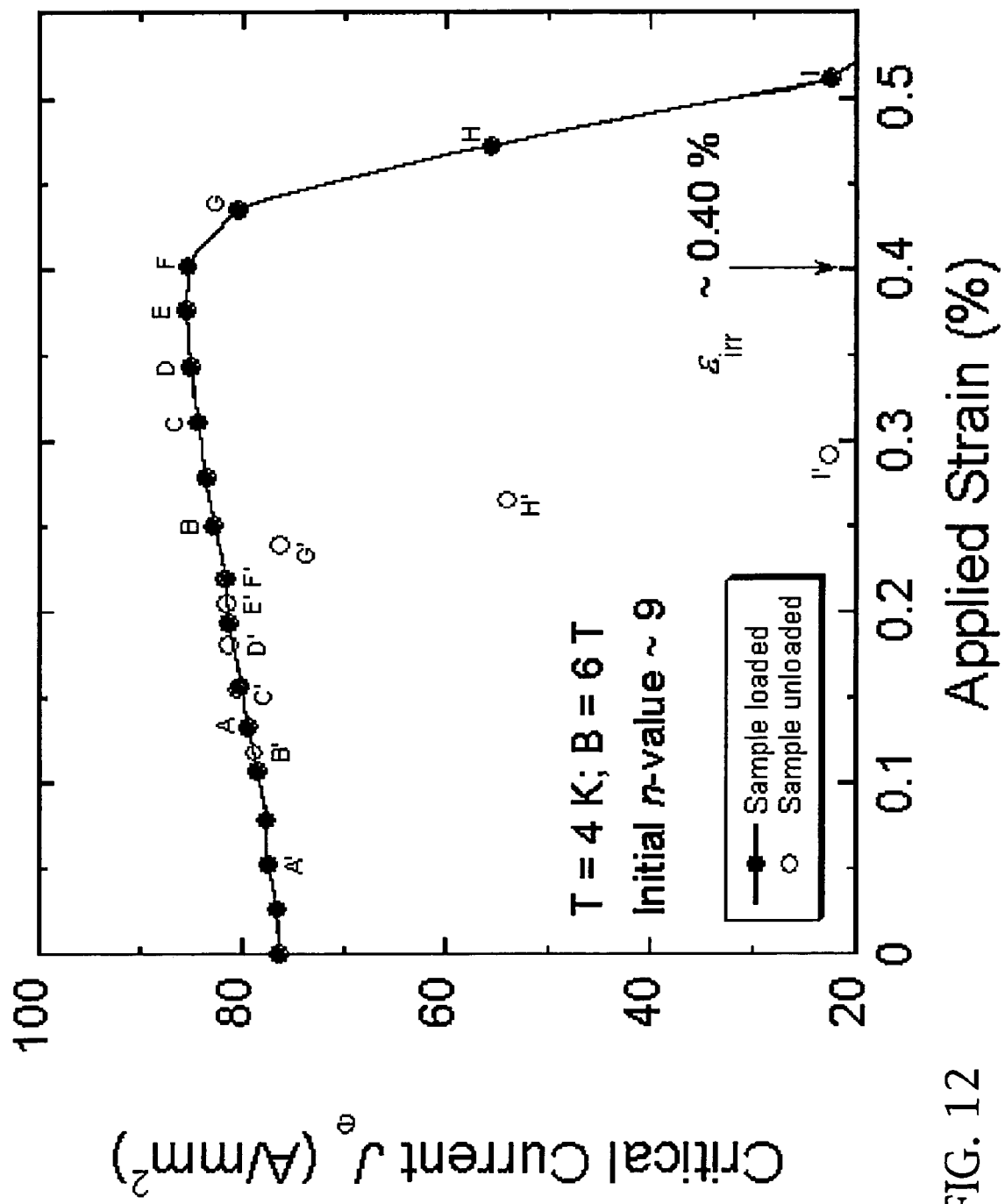
FIG. 12 is a graph of variation of the critical current of a sample of MGB in accordance with strain applied to the sample. The data illustrated in FIG. 12 was obtained by Najib Cheggour of the National Institute of Standards and Technology (NIST).

Moreover, with reference to FIG. 12, recent data concerning MGB wires shows that the dc critical current remains practically unchanged under stress of $\epsilon \leqq 0.4\%$. The graph of FIG. 12 was presented by Cheggour et al. in a poster at a "HyperTech" booth at the Applied Superconductivity Conference, 27 Aug.-1 Sep. 2006, Seattle, Wash. By the present inventors' calculations, this finding by Cheggour et al. translates to a radius of curvature of 0.1 cm, based on the estimation p~0.5 d/δ, where ρ, d and δ denote the radius of curvature, film thickness (assumed value 1 gm) and maximum strain, respectively. Therefore, the entire curvature-radii range associated with a typically shaped RF cavity preform 100 is comfortably within the flexural range tolerated by a typical inventive tile 200. In particular, it is reasonable to expect that an inventive MGB-coated metallic substrate tile 200 that has been made according to Moeckley et al.'s MGB-film-on-substrate methodology will be capable of bending and fitting in conformance with surface areas 1040N and 1050N of diverse and extensive curvatures.

Although the inventive tiles 200 shown in FIG. 6 through FIG. 9 are shown to have a rectangular planar shape (plan form), it is to be understood that an inventive tile can have practically any planar shape, since the suitability of an inventive tile's planar shape depends primarily on the location and contour of the RF cavity preform's surface region to which the inventive tile is to be adhered. An inventive tile can have a plan form that is: rectilinear, curvilinear, or both; regular or irregular; symmetrical or nonsymmetrical. For instance, an inventive tile's plan form can be: a regular polygon of any number of sides greater than two; an irregular polygon of any number of sides greater than two; a regular or symmetrical closed curved figure (e.g., a circle or an ellipse); an irregular or asymmetrical closed curved figure; a regular or symmetrical closed figure having at least one straight portion and at least one curved portion; an irregular or asymmetrical closed figure having at least one straight portion and at least one curved portion; etc.

Figure 14:
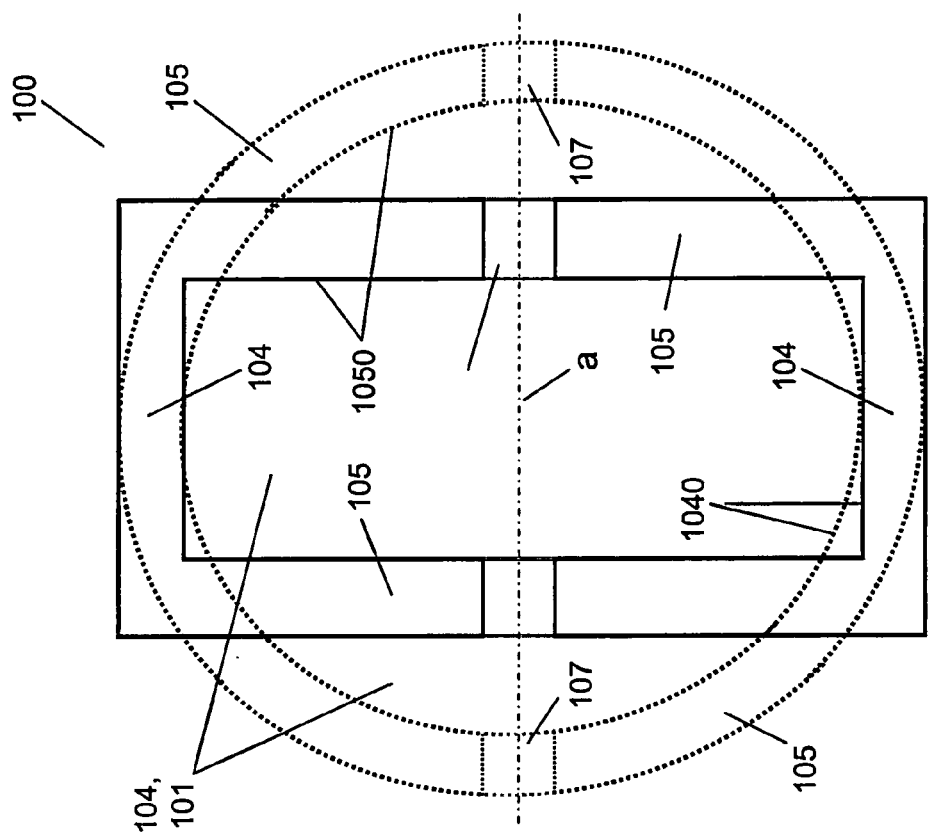
FIG. 14 is an axially longitudinal cross-sectional view of the rectangular RF cavity preform embodiment shown in FIG. 13, taken essentially through a geometric plane indicated by section line 14-14 in FIG. 13.
Figure 13:
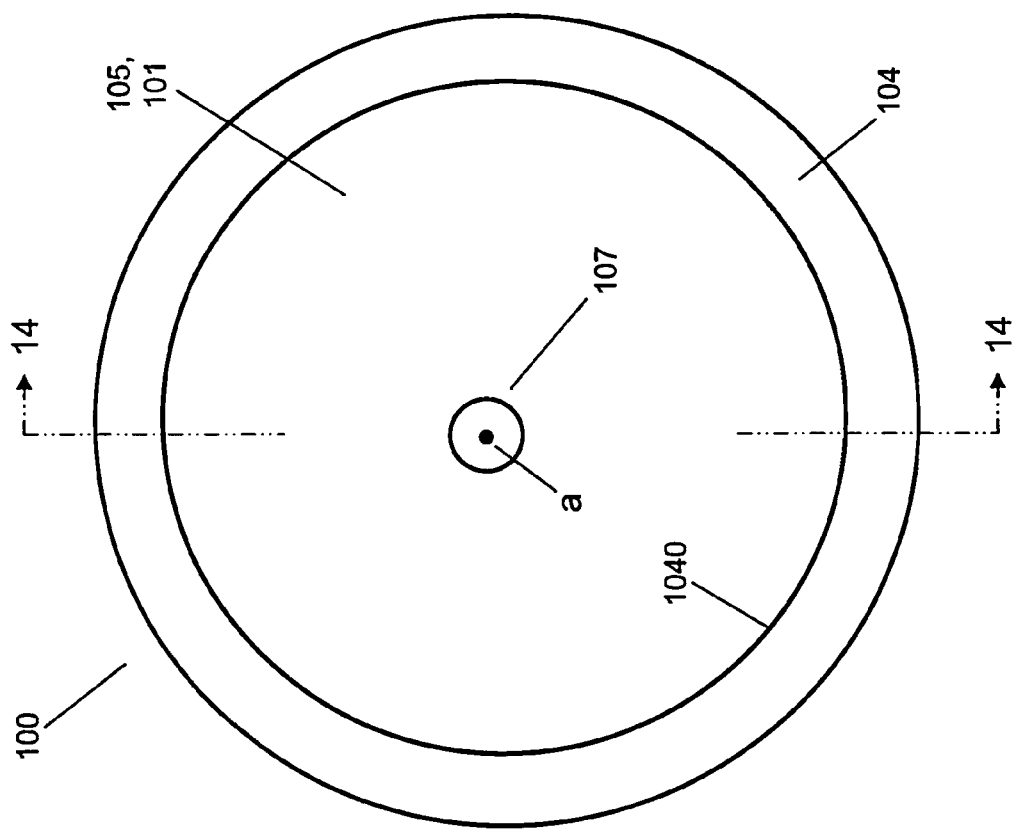
FIG. 13 is an axially transverse cross-sectional view of a rectangular RF cavity preform embodiment similar to that shown in FIG. 1.
Figure 16:
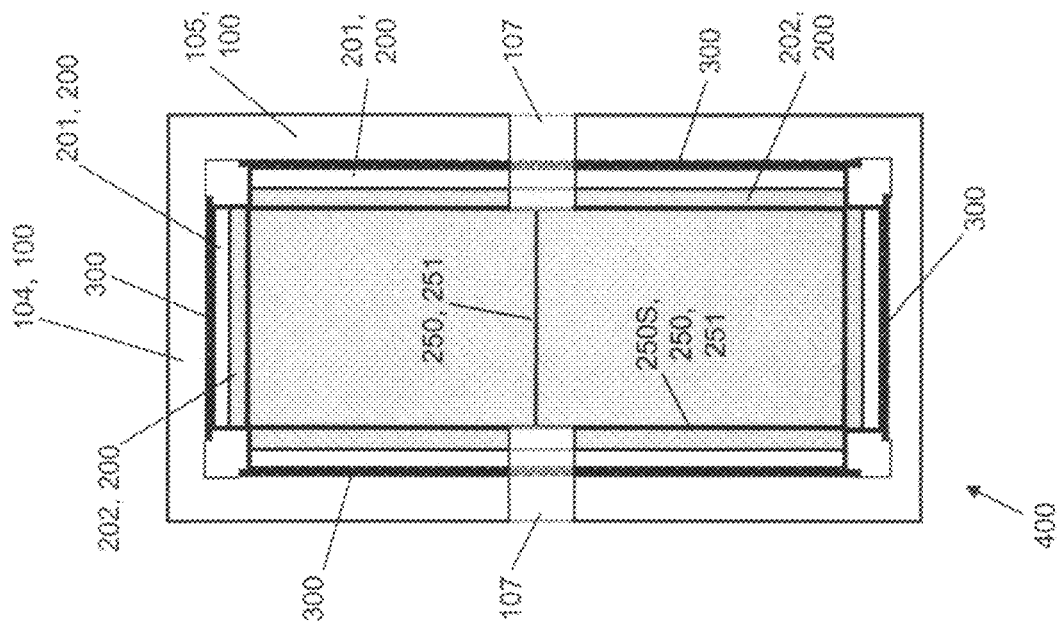
FIG. 16 is an axially longitudinal cross-sectional view of the inventive RF cavity embodiment shown in FIG. 15, taken essentially through a geometric plane indicated by section line 16-16 in FIG. 15. Inventive tile coverage is shown in FIG. 15 and FIG. 16 of the two axial-end walls and the circumferential wall. According to the inventive embodiment shown in FIG. 15 and FIG. 16, a minimal number of inventive tiles is implemented to cover the interior walls of the RF cavity preform shown in FIG. 13.
Figure 15:
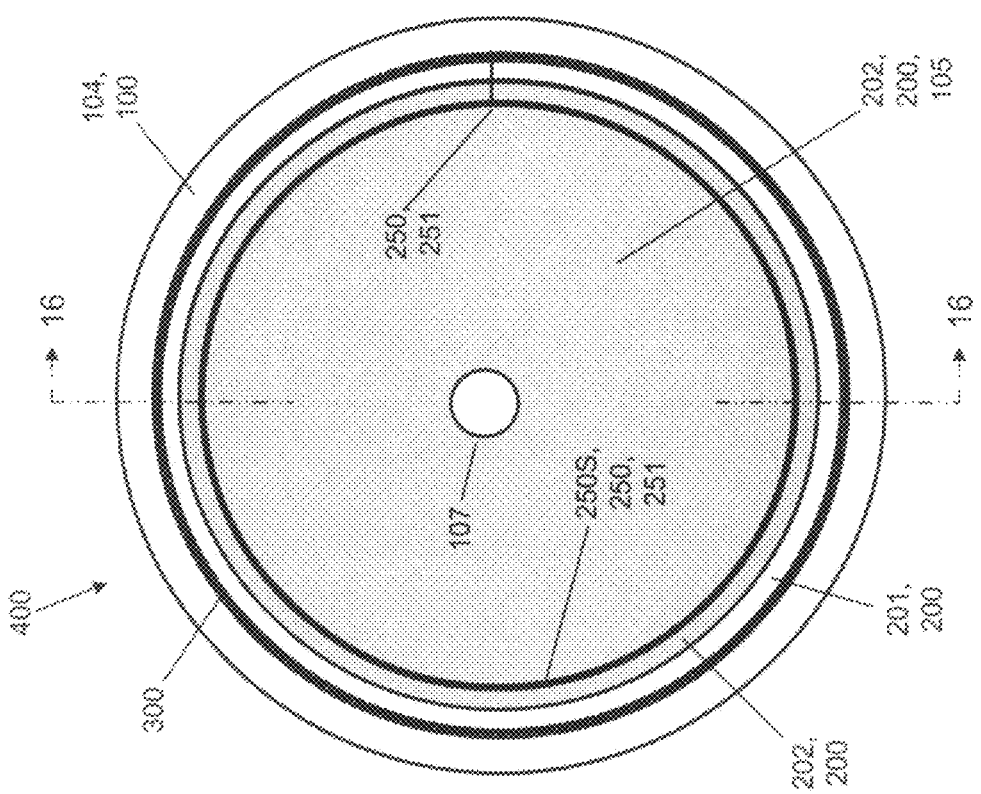
FIG. 15 is an axially transverse cross-sectional view, similar to the view of FIG. 13, of an embodiment of an RF cavity in accordance with the present invention.

Now referring to FIG. 13 through FIG. 24, plural HTS-coated metallic tiles 200 are inventively adhered to the interior surfaces of an RF cavity preform 100 in accordance with individual and relational geometries and an overall layout that are judiciously chosen by the inventive practitioner. As depicted in FIG. 13 and FIG. 14, cavity preform 100 includes two opposite axial-end walls 105 and a circumferential wall 104. Each axial-end wall 105 has a small central aperture 107 and an inside surface 1050. The sizes of the apertures 107 shown in figures herein are exaggerated for illustrative purposes. Circumferential wall 104 has an inside surface 1040. The two opposite axial-end inside surfaces 1050 and the circumferential inside surface 1040 circumscribe (enclose) an interior space (void) 101.

Although FIG. 13 and FIG. 15 through FIG. 22 more strictly correspond to the rectangularly profiled cavity preform 100 shown in solid line in FIG. 14, the skilled artisan who reads the instant disclosure will appreciate the like applicability of inventive principles to curvedly or partially curvedly profiled cavity performs 100 such as shown in dotted line in FIG. 14.

Figure 17:
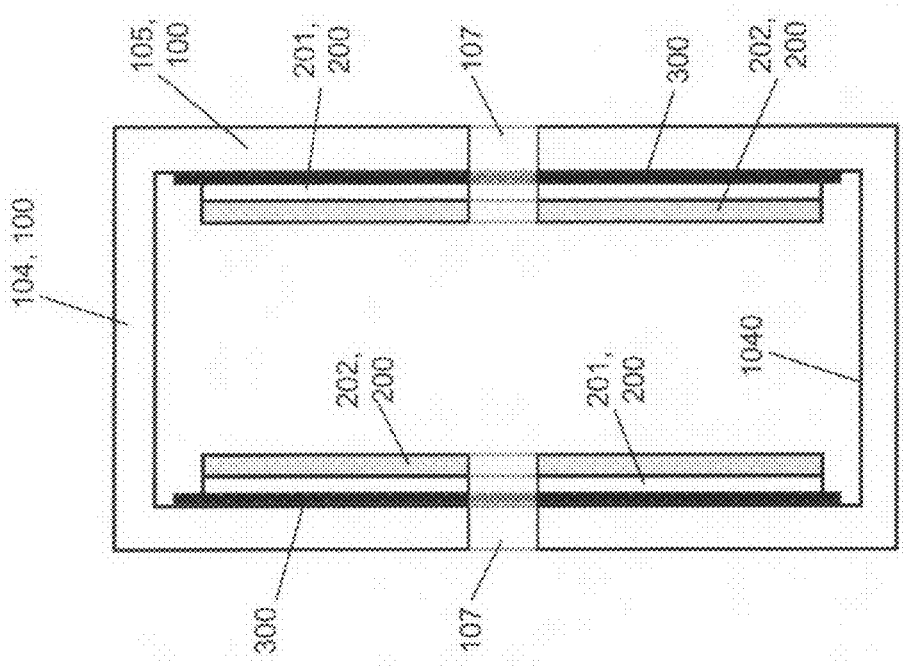
FIG. 17 and FIG. 18 are the views of FIG. 15 and FIG. 16, respectively, but showing inventive tile coverage of the two axial-end walls only. The view of FIG. 18 is taken essentially through a geometric plane indicated by section line 18-18 in FIG. 17.
Figure 18:
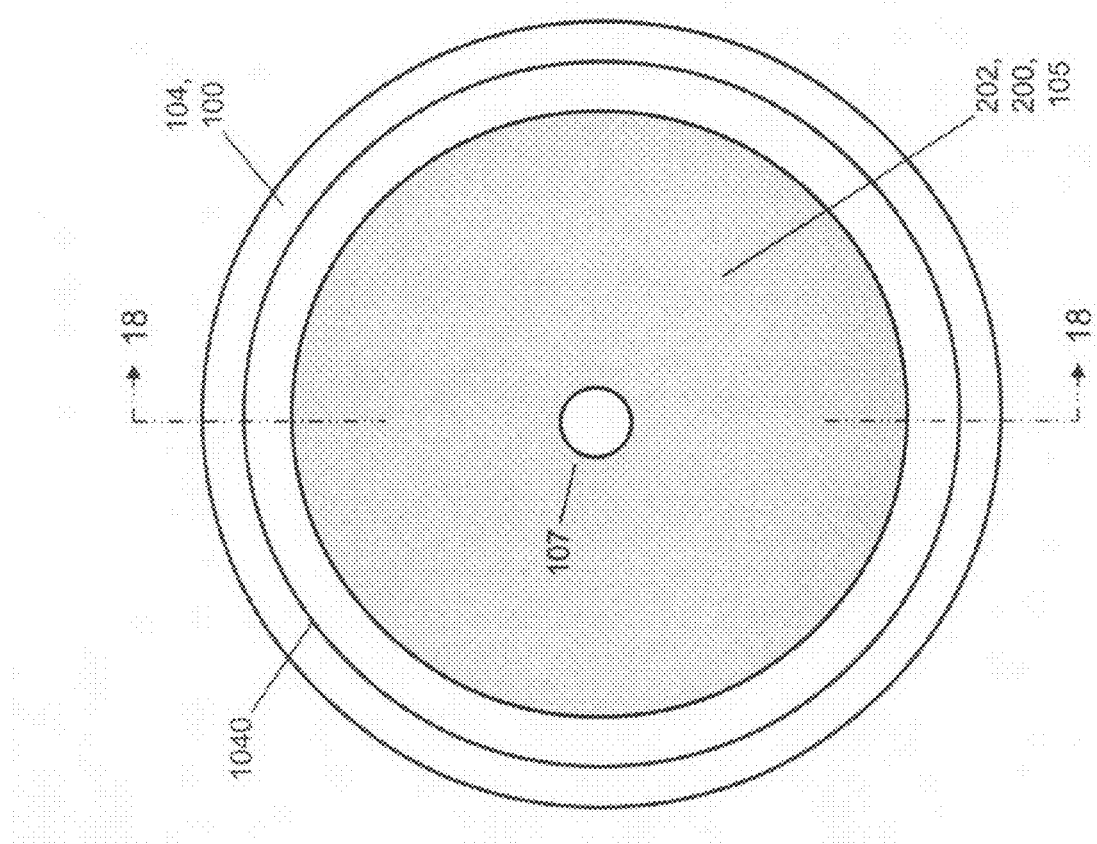

FIG. 15 through FIG. 20 illustrate an embodiment of an inventive RF cavity device 400 in which only three inventive tiles 200 are used for being adhered, via an adhesive material 300, to the inside wall surfaces of cavity preform 100. Particularly as shown in FIG. 17 and FIG. 18, two circular inventive tiles 200 are used, one at each axial-end wall 105, to cover the inside surface 1050 of the axial-end wall 105. A central hole 107 is provided in each circular tile 200 in order to leave uncovered the central aperture 107. Particularly as shown in FIG. 19 and FIG. 20, a rather elongated rectangular tile 200 is used to wrap entirely around the inside surface 1040 of the circumferential wall 104. A tight seam 250 is left at the juncture between the ends of the rectangular tile 200. As indicated by corner seams 250S in FIG. 15 and FIG. 16, seams 250 may also be formed at sharp "corners," such as along the geometric vertices of the perpendicular geometric angles existing between an axial-end wall 105 and the circumferential wall 104 of a rectangular-profile cavity preform 100.

FIG. 21 and FIG. 22 illustrate an embodiment of an inventive RF cavity 400 in which many inventive tiles 200 are used for being adhered, via an adhesive material 300, to the inside wall surfaces of cavity preform 100. Sixteen rectangular inventive tiles 200 are adjacently arranged, one after the other, in a single array around the entire inside surface 1040 of the circumferential wall 104. Fifty inventive tiles of various planar shapes are used at the axial-end walls 105 to cover the respective inside surface 1050 of the axial-end walls 105. At each axial-end wall 105, the twenty-five inventive tiles 200 have the following distribution of planar shapes: seven hexagonal inventive tiles 200; six triangular inventive tiles 200; and, twelve near-rectangular or near-trapezoidal inventive tiles, each exhibiting some curvature on one polygonal side. Each central hexagonal inventive tile 200 has a central hole for exposing the central aperture 107 of the axial-end wall 105. Inevitably, any adjacent pair of inventive tiles 200 has associated therewith at least one seam 250.

Inventive practice generally favors placement of the inventive tiles 200 so as to render the seams 250 as tightly or snugly as possible. According to typical inventive practice, the tiles 200 are closely situated with respect to each other so as to form narrow seams 250 between different pairs of tiles 200. The "inner layer" of the inventive RF cavity device 400 includes not only the tiles 200, but also filler material 251 in the seams 250. The tiles 200 and the filler material 251 combine so that the "inner layer" has an at least substantially even character.

FIG. 23 and FIG. 24 illustrate another embodiment of an inventive RF cavity 400 in which many inventive tiles 200 are used for being adhered, via an adhesive material 300, to the inside wall surfaces of cavity preform 100. Thirty-two rectangular inventive tiles 200 are closely arranged in a double array, sixteen rectangular inventive tiles 200 per circumferential row, around the entire inside surface 1040 of the circumferential wall 104. Twenty inventive tiles of irregular curved planar shapes are used at the axial-end walls 105, ten at each axial-end wall 105, to cover the respective inside surface 1050 of the axial-end walls 105. The seams 250 are shown in FIG. 23 to be complicatedly curvaceous, akin to the seams of a jigsaw puzzle.

Tight fitting of highly irregularly shaped inventive tiles 200 such as shown in FIG. 23 may be difficult to achieve in inventive practice because of the complex shapes and interrelationships that must be taken into consideration; nevertheless, a relatively complicated configuration, generally along the lines of that shown in FIG. 23, may be desirable for an inventive practitioner in order to minimize the presence of seams 250 in the higher intensity zones of the magnetic field that is expected to be generated when the inventive RF cavity device 400 is implemented in the context of a particular particle acceleration application.

In general, the tiles 200 of a particular inventive RF cavity 400 may be selected by the inventive practitioner to vary in terms of any of several characteristics, depending on the circumstances of their usage. According to some embodiments of the present invention's interiorly tiled cavity 400, not all tiles 200 of the inventive cavity 400 include the same superconductor material, an inventive strategy referred to herein as "superconductor hybridization." In addition or alternative to superconductor hybridization, tiles 200 of a given inventive RF cavity 400 can be rendered to distinguish from one another in one or more respects other than superconductor material, including but not limited to planar shape, through-thickness, and surface roughness. FIG. 15 through FIG. 24 illustrate by way of example how the planar shapes of the tiles 200 can be varied within a given inventive cavity 400. Moreover, tiles 200 having the same superconductor can be distinguished from each other in terms of their respective doping or lack thereof.

Furthermore, inventive practice permits utilization of two or more types of suitable materials, metallic or otherwise (e.g., composite), for the flexible layers 201. A suitable metallic material is generally preferred for the tile layers 201, firstly because it is flexible, and secondly because it is thermally conductive and thus serves to dissipate excessive heat, especially in the event that one or more "hot spots" exist in the inventive RF cavity 400.

As an example of an inventive cavity 400 having selectively varied tiles 200, the tiles 200 that are exposed to a high magnetic field may be selected to have a coating layer 202 of judiciously-doped MGB, which is known to have very high critical fields. Further, the tiles 200 that are exposed to a high electric field may be selected to have an exceptionally smooth coating layer 202. In addition, the tiles 200 that are situated at relatively flat areas of the cavity preform 100 may be selected to have yet another distinguishing characteristic, such as being composed of a different superconductor (e.g., YBCO).

The present invention's flexible HTS-coated tiles 200 can include MGB and/or one or more other high temperature superconductors, as constituents of the HTS layers 202. FIG. 23 and FIG. 24 illustrate but one example of diverse modes of inventive practice involving superconductor hybridization. As shown in FIG. 23 and FIG. 24, some HTS-coated tiles 200 include an HTS layer $202_{MGB}$ (which is composed of MGB), while other HTS-coated tiles 200 include an HTS layer $202_{YBCO}$ (which is composed of YBCO). For given applications, inventive "hybrid-HTS" RF cavities 400 such as exemplified in FIG. 23 and FIG. 24 can potentially outperform inventive "uniform-HTS" RF 400 cavities, particularly if modularization is effected.

There is practically no limit to the sizes of the inventive RF cavities 400, or of the HTS-coated tiles 200 that line their interiors. For instance, the wafer fabrication method of Moeckley et al. permits "scalability" to larger wafers; Moeckely et al.'s wafers can be scaled up in size by scaling up the dimensions of the growth chamber.

With regard to fabrication of inventive RF cavities 400, the inventive method is typically practiced so as to provide a cavity preform 100 of selected shape and dimensions, and to completely line all of the interior walls of the cavity preform 100 with plural tiles 200. As completed, a typical inventively "made-from-scratch" RF cavity 400 represents a four-layered material system. Starting from the inside and proceeding outward, the first (innermost) layer includes the HTS coating layers 202 of their respective tiles 200; the first layer also includes some filler material 251 in the seams 200. Adjacent to the first layer, the second layer includes the metallic substrate layers 201 of their respective tiles 200; the second layer also includes some filler material 251 in the seams 200. Adjacent to the second layer, the third layer includes the adhesive material 300. Adjacent to the third layer is the outermost layer, which includes the cavity preform 100. In a sense, the fourth layer is the "outer layer," and the first and second layers are sub-layers of an overall tile-inclusive "inner layer" of the inventive RF cavity 400.

Construction "from scratch" of inventive RF cavities 400 typically provides for lining the entire or substantially the entire inside surface (e.g., practically every "square inch" of the interior walls) of a cavity preform 100. Alternatively, inventive construction "from scratch" can provide for lining a part or parts (e.g., one or more areas) of the cavity preform 100's inside surface.

As an alternative to constructing inventive RF cavities 400 "from scratch," the present invention can be practiced so as to "retrofit" existing conventional cavities such as Nb cavities. As inventive retrofitting is typically practiced, one or more HTS-coated tiles 200 (e.g., MGB-coated tiles 200) are selectively placed at strategic locations on one or more interior walls of an Nb cavity, especially where the radiation fields are particularly large. According to this inventive approach to selective tile placement, only a portion (or portions) of the inside surface of the retrofit-style inventive cavity 400 is (are) the HTS tile material; the remainder of the inside surface of the retrofit-style inventive cavity 400 is the Nb cavity's own Nb (low temperature superconductor) material. An alternative inventive approach is to cover the entire inside surface of the conventional cavity so as to produce a retrofit-style inventive cavity 400 in which the entire inside surface is the HTS tile material.

A conventional cavity structure serves as the frame for inventive tiling in order to create a retrofit-style inventive cavity 400, similarly as a cavity preform structure serves as the frame for inventive tiling in order to create a made-from-scratch inventive cavity 400. Furthermore, a retrofit-style inventive cavity 400 represents a four-layer material system in those areas in which tiles 200 are present, similarly as a made-from-scratch inventive cavity 400 represents a four-layer material system. Regardless of whether inventive practice involves making inventive RF cavities from scratch or by retrofitting existing RF cavities, modularization or standardization of HTS-coated tiles 200 can facilitate inventive designs and result in high performance at significant cost savings. "Modular" HTS-coated tiles of a variety of geometric and constitutional descriptions can be made commercially available to facilitate inventive practice and to encourage innovativeness of inventive cavity designs.

As general guidance for the inventive practitioner, the seams 250 between the tiles 200 should be minimized in terms of their number and dimensions (e.g., lengths and thicknesses of seams 250). Expressed another way, the percentage of the inventive cavity 400's inside surfaces 1040 and 1050 that is covered with tiles 200, as distinguished from inter-tile seams 250, should be maximized. In addition, the flexibility of the tiles 200 should be maximized, especially in terms of the shapes and materials of the tiles 200. By way of elaboration, according to the inventive guidelines further discussed hereinbelow, design parameters that should be optimized include (i) the shape of the inventive RF cavity 400, (ii) the shapes (including sizes) of the tiles 200, and (iii) the layout of the tiles 200 on the cavity inside walls 1040 and 1050.

Generally speaking, the shape of the inventive RF cavity 400, when it is implemented in association with or as a component of particle accelerative apparatus, determines the magnetic field strength distribution inside the inventive RF cavity 400. In particular, the inventive RF cavity 400 shape determines the areas and locations of the inside surfaces 1040 and 1050 where the magnitude of the magnetic field H is high. Due to the considerably higher critical field of MGB as compared with Nb, RF cavity shapes that are unacceptable for an Nb-based RF cavity may be admissible for an MGB-based RF cavity.

The inventive RF cavity 400 shape should be selected by the inventive practitioner so as to avoid any interior wall region having a radius of curvature that is smaller than the tolerable curvature of the superconducting tiles 200 in terms of flexing/bending so as to retain superconductive integrity. Based on calculations performed by the present inventors with regard to cavity designs in the Brookhaven National Laboratory, the present inventors believe that this constraint will be easily met throughout the cavity walls of the vast majority of inventive RF cavity 400 designs.

For a given inventive RF cavity 400 shape, a tradeoff should be struck between the number of tiles 200 (and therefore their sizes) and the degrees of strain that the tiles 200 must sustain. In other words, the layout of the tiles 200 should aim to minimize the number of tiles 200, while avoiding any superconductive compromise of any tile 200 due to excessive strain. As a general rule, a configuration of fewer (and hence, larger) tiles 200 will have associated therewith a greater strain on individual tiles 200; conversely, a configuration of more (and hence, smaller) tiles 200 will have associated therewith a lesser strain on individual tiles 200.

For a given inventive RF cavity 400 shape, the tiles 200 should be shaped and laid out so as to locate the seams 250 (which are between the tiles 200) as close as possible to the areas where the magnetic field is low. In a typical inventive RF cavity 400, the standing waves necessarily have "nodes" (places of zero fields) at the surface of the inventive RF cavity 400. At the nodes, no electrical current flows. Generally speaking, it is a recommended inventive design strategy of the tile 200 configuration that the seams 250 conform to the locations or distribution of the nodes.

The inventive practitioner should consider the above factors and tradeoffs, seeking to optimize the shape of the inventive RF cavity, the shapes (including sizes) of the tiles 200, and the layout of the tiles 200. A detailed quantitative analysis can be performed by the inventive practitioner of the magnetic field distribution for each prospective inventive cavity 400 shape. For instance, consider the two extreme cases of an RF cavity preform 100 having (a) a purely rectangular cross-section (such as shown in FIG. 1 and by solid line in FIG. 14) and (b) a purely oval cross-section (such as shown in FIG. 4 and by dotted line in FIG. 14). The purely rectangular cavity preform 100 shape tends to simplify the shapes and layout of the tiles 200 that are inventively bonded to the inside surfaces, but tends to be problematic due to multipacting at the sharp corners. On the other hand, the purely oval cavity preform 100 shape tends to minimize multipacting, but tends to impose greater strains on the tiles 200 and in larger surface areas. The inventive practitioner can balance these considerations for contemplated inventive RF cavities 400, and can arrive at interesting inventive RF cavity 400 designs.

Once the entire interior surface of the RF cavity preform 100 has been tiled so as to form an inventive RF cavity 400, surface treatment is typically needed in inventive practice to smooth out the areas along and around the seams 250, situated between the tiles 200. The seams 250 can be filled in with a suitable "low-temperature" filler material 251, especially one that will not contribute to multipacting. Examples of filler materials 251 that may be suitable for inventive practice include varnish, resin, epoxy, superconductor powder (e.g., magnesium diboride powder), highly conductive metal powder (e.g., silver powder), highly conductive metal welding material (e.g., silver welding material), etc. The filler material 251 must have a durable low-temperature quality in the sense of being capable of maintaining its compositional and physical integrity at the very cold temperatures associated with typical inventive practice.

Application by an inventive practitioner of filler material 251 to seams 250 may be analogous to application by a tile layer of grout material to seams between the ceramic tiles of an ordinary bathroom floor; generally, the common objective is fill crevices between discrete pieces. Not unlike conventional grout or grout-like materials, the present invention's filler material 251 is applied to the seams 250, and excess filler material 251 is removed. This final cavity-surface smoothing stage is not expected to be difficult, since the surface roughness of the HTS film layer 202 is usually very small, and the thickness of the metallic substrate layer 201 as well as the smoothness of the cavity preform 100 inside surface can usually be tightly controlled. Techniques and protocols analogous to those traditionally used in association with conventional Nb-based RF cavities can be used in association with the present invention's HTS-based RF cavities 400. Typical surface treatment of conventional Nb-based RF cavities is electro-chemical in nature, and employs high-pressure rinsing; see Vaglio, supra; E. Chiaveri, supra; P. Kneisel, supra.

Figure 7:
FIG. 7 is a side elevation view ("edgewise" view) of the inventive tile embodiment shown in FIG. 6.
Figure 8:
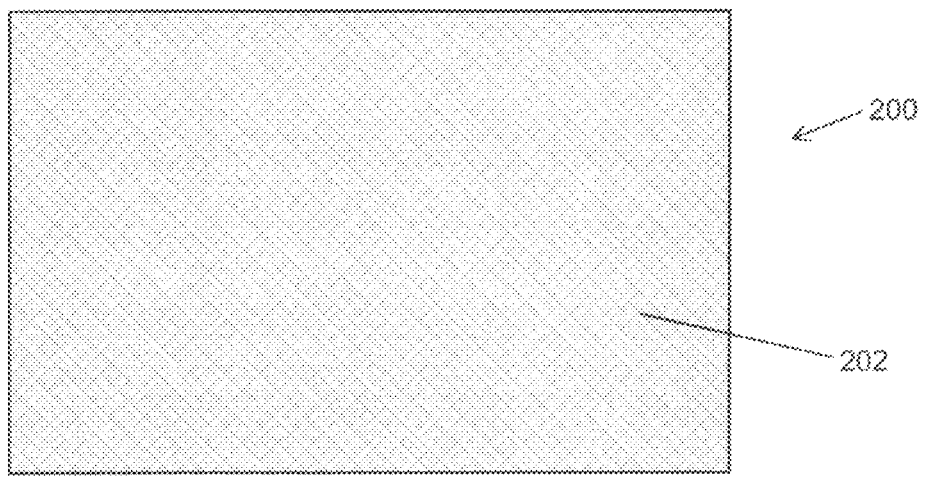
FIG. 8 is a top plan view of the inventive tile embodiment shown in FIG. 6.
Figure 9:
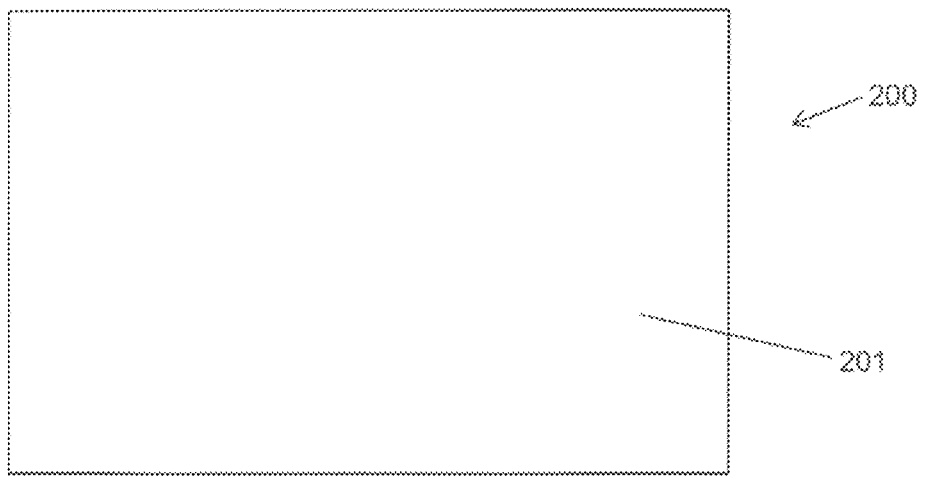
FIG. 9 is a bottom plan view of the inventive tile embodiment shown in FIG. 6.

As shown in FIG. 6 and FIG. 7, some tiles 200 that are suitable for inventive practice include a substrate layer 201 and a superconductor layer 202 that are contiguous to each other—that is, with nothing therebetween. Reference now being made to FIG. 25 and FIG. 26, some tiles 200 that are suitable for inventive practice also include an intermediate buffer layer 203, which typically is much thinner than the substrate layer 201 and the superconductor layer 202. As shown in FIG. 25 and FIG. 26, thin buffer layer 203 is directly between substrate layer 201 and superconductor layer 202. The purpose of the buffer layer 203 is to avoid interdiffusion between the substrate layer 201 and the superconductor layer 202. For instance, the present inventors have found that molybdenum (Mo) can be used as a buffer layer 203 between a copper substrate layer 201 and a magnesium diboride layer 202.

Although flexible tiles 200 are frequently embodied as flat and flexible tiles, inventive practice can provide for flexible tiles 200 that are non-flat (non-planar). Broadly speaking, the tiles 200 that may be suitable for inventive practice span the theoretical gamut of geometric shapes of geometric surface portions that may be "excised" from geometric solids of any description. Non-flat flexible tiles 200 may be especially propitious for lining the interiors of cavity preforms that are more extremely curved.

For instance, a flexible tile 200 can be defined by the geometric frustum of any of a variety of conventionally defined three-dimensional geometric shapes, including but not limited to the following: sphere; prolate spheroid; circular cylinder; non-circular (e.g., elliptical or oval) cylinder; cone. The term "frustum," as used herein, denotes a "slice" of a three-dimensional geometric shape. A frustum can be a slice formed on either side of a geometric plane that passes through the three-dimensional geometric shape. Alternatively, a frustum can be a slice formed between two geometric planes, parallel or non-parallel, that pass through the three-dimensional geometric shape.

The two main inventive configurational modes of lining interior preform surfaces with frustum-shaped tiles are horizontal orientation mode and vertical orientation mode. With reference to FIG. 27, the interior wall surfaces of preform $100_{RC}$ are shown completely lined with various horizontally oriented frustum-shaped tiles 200, as follows. In each wall end 105, the inside surface 1050 is lined with a tile $200_{F-1}$ at the end tip, and with two tiles $200_{F-2}$ near the end tip. In the wall circumference (i.e., along the medial length), the inside surface 1040 is lined with four tiles $200_{F-3}$. Tiles $200_{F-1}$ each describe a "cap-shaped" frustum, formed by cutting through a sphere or a prolate spheroid, using one geometric plane. Tiles $200_{F-2}$ each describe a "closed-strip-shaped" frustum, formed by cutting through either a sphere, or a prolate spheroid, or a cone, using two parallel geometric planes. Tiles $200_{F-3}$ each describe a "closed-strip-shaped" frustum of a different kind, formed by cutting through a circular cylinder or a non-circular cylinder using two parallel geometric planes.

As also illustrated in FIG. 27, an alternative inventive approach to horizontal orientation mode is vertical orientation mode. The interior wall surfaces of preform $100_{RC}$ can be lined with various vertically oriented frustum-shaped tiles 200. Like horizontally oriented tiles $200_{F-2}$, vertically oriented tiles $200_{F-4}$ each describe a "closed-strip-shaped" frustum, formed by cutting through either a sphere, or a prolate spheroid, or a cone, using two parallel geometric planes. Although two adjacent vertically oriented frustum-shaped tiles, viz. tiles $200_{F-4}$, are depicted, readily envisioned from FIG. 27 are the various ways in which vertically oriented frustum-shaped tiles 200 can be shaped and placed to line the entirety of the cavity surface interior. Inventive practice may tend to prefer vertical orientation mode over horizontal orientation mode, in terms of minimizing the amounts of current crossing the seams.

The tiles 200 depicted in FIG. 27 are merely illustrative of diverse frusta that can be adhered to the inside walls of cavity preforms 100, and are not suggestive of inventive configurational design preference. For instance, the relatively high number of and relatively close separations between the parallel seams 250 as shown may tend to be counterproductive to effective operation of an inventive RF cavity 400. In this regard, longitudinally wider tiles 200 than shown in FIG. 27 may be more suitable for more inventive embodiments.

An advantage of a frustum-shaped tile 200 over a flat tile 200 is that the former can be selected to have an original shape that is conformal or nearly conformal with respect to a large non-flat interior surface area of a preform 100. A frustum-shaped tile 200 is inherently capable of covering large surface areas at least substantially conformally. In contrast, originally flat tiles 200 always need to flex a least a little in order to be conformal with respect to a non-flat interior surface area. Furthermore, it will frequently be the case that fewer frustum-shaped tiles 200 than flat tiles 200 will be needed to cover the same large curved surface area. Generally speaking, less flexibility will be required for frustum-shaped tiles 200 than for flat tiles 200, and fewer seams will be associated with a configuration of frustum-shaped tiles 200 than of flat tiles 200.

The present inventors believe that the wafer fabrication teachings of Moeckley et al. are practicable for making "frustum-shaped" tiles 200 that are suitable for inventive practice. Chamber modification will likely be required for accommodating most frustum-shaped substrates upon which superconductor film is to be deposited, but the basic principles of Moeckley et al.'s method will be applicable.

Figure 28:
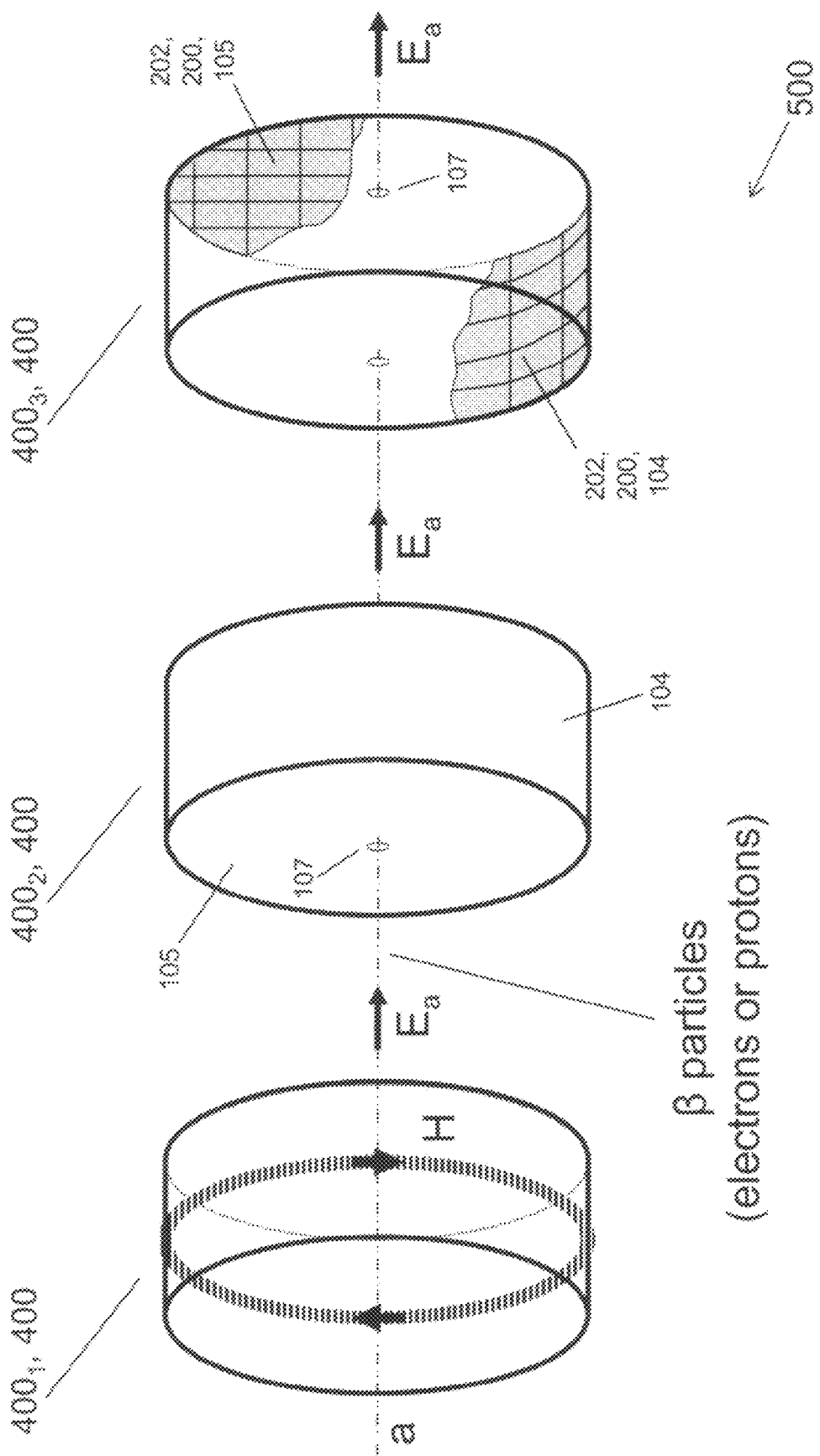
FIG. 28 is perspective view of an embodiment of a synchronized linear radio frequency (RF) cavity array apparatus in accordance with the present invention. Although the inventive RF cavities are shown in FIG. 25 to be most similar in shape to the cavity preform shown in FIG. 1, it is to be understood that the inventive RF cavities can each have any pillbox shape that is suitable for inventive practice. The rightmost inventive RF cavity shown in FIG. 25 has portions removed to reveal interior surface areas lined with tiles in accordance with the present invention.

Reference now being made to FIG. 28, according to frequent inventive practice, plural inventive pillbox-shaped cavities 30 are implemented so as to be linearly arrayed so that each inventive pillbox-shaped cavity 30 has its geometric axis a aligned with the trajectory of the charged-particle beam $\beta$ in the charged-particle accelerative device 500. Each inventive RF cavity 400 has two holes 107 on geometric axis a to permit passage of the charged particle beam $\beta$ along geometric axis a. Each inventive RF cavity 400 has associated therewith an electric field E that is coincident with geometric axis a and that is pointed in one direction, and further has associated therewith a magnetic field H that is oriented vis-à-vis electric field E in accordance with the "right-hand rule." As beam $\beta$ travels along geometric axis a, each inventive RF cavity 400 through which beam $\beta$ passes serves to accelerate beam $\beta$ in the same direction, due to the influence of the electric field E. Thus, as highly diagrammatically depicted in FIG. 28, beam $\beta$ is progressively accelerated, in turn, by inventive RF cavities $400_1$, $400_2$, and $400_3$.

The tile 200 designs shown in FIG. 15 through FIG. 25, FIG. 27 and FIG. 28 are not intended to suggest that same or similar designs are recommended for inventive practice. Rather, the portrayed tile 200 designs serve to illustrate the variety of geometric shapes and arrangements that the present invention can implement. In fact, the inventive tile 200 designs shown in FIG. 21 through FIG. 25, FIG. 27 and FIG. 28, in particular, would tend to be undesirable because of significantly less than optimal minimization of the amounts of currents traversing the seams 250. The inventive tile 200 design shown in FIG. 15 through FIG. 20 would more likely be suitable for given applications because of its small number of seams 250.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. A radio frequency cavity device comprising a rigid structure and a plurality of flexible tiles, said rigid structure having an interior space and an inside surface bounding the interior space, each said flexible tile including a flexible substrate and a superconductor thin film deposited upon said substrate, each said flexible tile being coupled with said rigid structure, said coupling of each said flexible tile with said rigid structure including adherence of said flexible tile to said rigid structure, said adherence including pressing of said flexible tile upon a said portion of said inside surface, each said flexible tile being adhered so that its said substrate conformingly adjoins a said portion of said inside surface and so that its said superconductor thin film is exposed to said interior space, at least one said portion of said inside surface being curved, at least one said flexible tile being adhered so that its said substrate conformingly adjoins a curved said portion of said inside surface, wherein said superconductor thin film of each said flexible tile that is adhered so that its said substrate conformingly adjoins a curved said portion is composed of magnesium diboride, and wherein each said flexible tile that is adhered so that its said substrate conformingly adjoins a curved said portion is flexible to a radius of curvature of greater than or equal to 0.5 centimeters whereby said superconductor thin film is capable of flexing in concert with its said substrate so as to at least substantially retain its superconductor character, at least two said flexible tiles being characterized by different forms with respect to at least one of size and shape.

2. The radio frequency cavity device of claim 1, wherein said superconductor thin film of each said flexible tile is composed of a high temperature superconductor.

3. The radio frequency cavity device of claim 1, wherein:
at least one said portion of said inside surface is planar,
at least one said flexible tile is adhered so that its said substrate conformingly adjoins a planar said portion of said inside surface;
said superconductor thin film of at least one said flexible tile that is adhered so that its said substrate conformingly adjoins a planar said portion is composed of yttrium barium copper oxide.

4. The radio frequency cavity device of claim 1, wherein:
at least one said portion of said inside surface is planar,
at least one said flexible tile is adhered so that its said substrate conformingly adjoins a planar said portion of said inside surface;
said superconductor thin film of each said flexible tile is composed of at least one of magnesium diboride and yttrium barium copper oxide.

5. The radio frequency cavity device of claim 1, wherein at least one said flexible tile includes a buffer layer between said substrate and said superconductor thin film.

6. The radio frequency cavity device of claim 1, wherein said substrate of at least one said flexible tile is composed of a metallic material.

7. The radio frequency cavity device of claim 1, wherein said substrate of each said flexible tile is composed of a metallic material.

8. The radio frequency cavity device of claim 7, wherein said thin film of each said flexible tile is composed of a high temperature superconductor.

9. The radio frequency cavity device of claim 1, wherein said rigid structure describes a pillbox shape, said pillbox shape being an at least generally cylindrical shape.

10. The radio frequency cavity device of claim 1 further comprising filler material in narrow seams between said flexible tiles, said flexible tiles being contiguously separated with respect to each other so as to define said seams, wherein the combination of said flexible tiles and said filler material describes an at least substantially level inward-facing surface surrounding said interior space.

11. The radio frequency cavity device of claim 10, wherein:
the device has an axis of symmetry;
at least one said seam is between two said flexible tiles and is along the axis of symmetry;
at least one said seam is between two said flexible tiles and is transverse the axis of symmetry.

12. A plural-layer material system suitable for use for accelerating atomic particles, the system encompassing a void and comprising a rigid outer layer and an inner layer, said inner layer including plural flexible tiles, each said flexible tile including a flexible metallic substrate and a high temperature superconductor thin film deposited upon said substrate, said flexible tiles being attached to said outer layer so that the respective said metallic substrates adjacently conform to said outer layer and so that the respective said high temperature superconductor thin films border upon said void, said attachment of each said flexible tile to said outer layer including adherence of said flexible tile to said outer layer, said adherence including pressing of said flexible tile upon said outer layer, wherein:
said outer layer has at least one curved region;
at least one said flexible tile is flexibly and conformingly attached to a said curved region of said outer layer;
said high temperature superconductor thin film of each said flexible tile that is attached to a said curved region of said outer layer is composed of magnesium diboride;
each said flexible tile that is attached to a said curved region of said outer layer is capable of flexing to a radius of curvature of greater than or equal to 0.5 centimeters so that said high temperature superconductor thin film and said substrate flex together in the absence of significant compromise of the superconductor character of said high temperature superconductor thin film;
at least two said flexible tiles differ from each other in terms of either size, or shape, or both size and shape.

13. The plural-layer material system of claim 12, wherein:
said flexible tiles are closely situated with respect to each other so as to form seams between said flexible tiles;
said inner layer further includes filler material in said seams;
said inner layer is characterized by an inner surface delimiting said void;
said flexible tiles and said filler material combine so that said inner layer is at least substantially even in terms of levelness of said inner surface.

14. The plural-layer material system of claim 12, wherein:
the system further comprises an adhesive layer joining said flexible tiles and said outer layer;
at least two said flexible tiles are closely situated with respect to each other so as to form at least one seam between at least one pair of said flexible tiles;
said inner layer further includes filler material in at least one said seam.

15. The plural-layer material system of claim 14, wherein:
the plural-layer system is characterized by an axis of symmetry;
at least one said seam between a pair of said tiles has filler material therein and is oriented in an axial direction;
at least one said seam between a pair of said tiles has filler material therein and is oriented in a direction transverse to an axial direction.

* * * * *